United States Patent
Shiga et al.

(10) Patent No.: US 9,817,598 B2
(45) Date of Patent: Nov. 14, 2017

(54) MEMORY DEVICE CABLE OF HIGH WRITE EFFICENCY

(71) Applicant: TOSHIBA MEMORY CORPORATION, Tokyo (JP)

(72) Inventors: Hidehiro Shiga, Yokohama Kanagawa (JP); Masanobu Shirakawa, Chigasaki Kanagawa (JP); Tokumasa Hara, Kawasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/346,713

(22) Filed: Nov. 8, 2016

(65) Prior Publication Data

US 2017/0255410 A1    Sep. 7, 2017

(30) Foreign Application Priority Data

Mar. 7, 2016    (JP) .................................. 2016-043794

(51) Int. Cl.
*G11C 7/00* (2006.01)
*G06F 3/06* (2006.01)

(52) U.S. Cl.
CPC .......... *G06F 3/0625* (2013.01); *G06F 3/0634* (2013.01); *G06F 3/0685* (2013.01)

(58) Field of Classification Search
CPC ............ G11C 16/0483; G11C 11/5628; G11C 16/3481; G11C 16/10; G11C 2211/5624
See application file for complete search history.

(56) References Cited

U.S. PATENT DOCUMENTS

| 8,385,131 | B2 | 2/2013 | Seol | |
|---|---|---|---|---|
| 8,593,872 | B2 | 11/2013 | Shirakawa | |
| 9,230,665 | B2 | 1/2016 | Hosono | |
| 2002/0075727 | A1* | 6/2002 | Jeong | G11C 16/10 365/185.28 |
| 2002/0118569 | A1* | 8/2002 | Jeong | G11C 16/10 365/185.18 |
| 2005/0057966 | A1* | 3/2005 | Nazarian | G11C 16/12 365/185.01 |
| 2012/0081946 | A1* | 4/2012 | Kawabata | G11C 11/5685 365/148 |
| 2014/0063972 | A1 | 3/2014 | Maeda | |
| 2014/0211568 | A1* | 7/2014 | Mui | G11C 11/5642 365/185.21 |
| 2015/0078080 | A1* | 3/2015 | Lee | G11C 11/56 365/185.03 |
| 2016/0027504 | A1* | 1/2016 | Lee | G11C 11/5635 365/185.03 |

FOREIGN PATENT DOCUMENTS

JP    2014044784 A    3/2014

* cited by examiner

*Primary Examiner* — Tuan T Nguyen
(74) *Attorney, Agent, or Firm* — Patterson & Sheridan, LLP

(57) ABSTRACT

A memory device includes a first memory string including a first selection transistor and a first memory cell, a second memory string including a second selection transistor and a second memory cell, a bit line electrically connected to the first memory string and the second memory string, and a control circuit configured to perform a collective write operation on the first memory cell and the second memory cell by applying a voltage to turn on the first transistor, a voltage to turn on the second transistor, and then a program voltage at the same time to gates of the first and second memory cells.

20 Claims, 20 Drawing Sheets

FIG. 10

| Input cycle | I/O7 | I/O6 | I/O5 | I/O4 | I/O3 | I/O2 | I/O1 | I/O0 |
|---|---|---|---|---|---|---|---|---|
| 1 | a7 | a6 | a5 | a4 | a3 | a2 | a1 | a0 |
| | a14-0:Column | | | | | | | |
| 2 | a15 | a14 | a13 | a12 | a11 | a10 | a9 | a8 |
| | | a14-0:Column | | | | | | |
| 3 | a23 | a22 | a21 | a20 | a19 | a18 | a17 | a16 |
| | a23-18:WL | | | | | | a17-16:String | |
| 4 | a31 | a30 | a29 | a28 | a27 | a26 | a25 | a24 |
| | a35-25:Block | | | | | | | a24: Plane |
| 5 | a39 | a38 | a37 | a36 | a35 | a34 | a33 | a32 |
| | | a38-36:Chip | | | a35-25:Block | | | |

FIG. 11
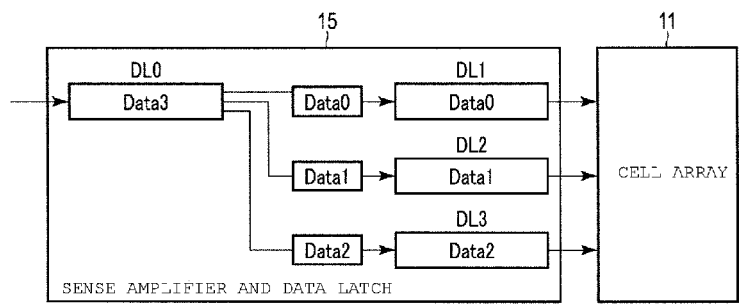
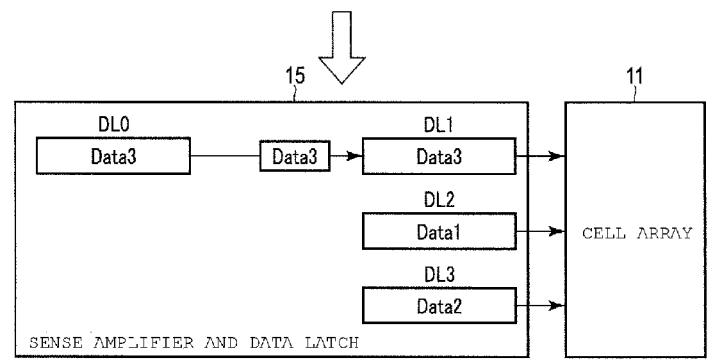
FIG. 12A
FOUR CELL UNIT INDIVIDUAL WRITING (WITH VERIFICATION)
FIG. 12B
FOUR CELL UNIT COLLECTIVE WRITING (WITHOUT VERIFICATION)
FIG. 12C
EXTRACTION OF ONLY WRITING FROM FOUR CELL UNIT INDIVIDUAL WRITING

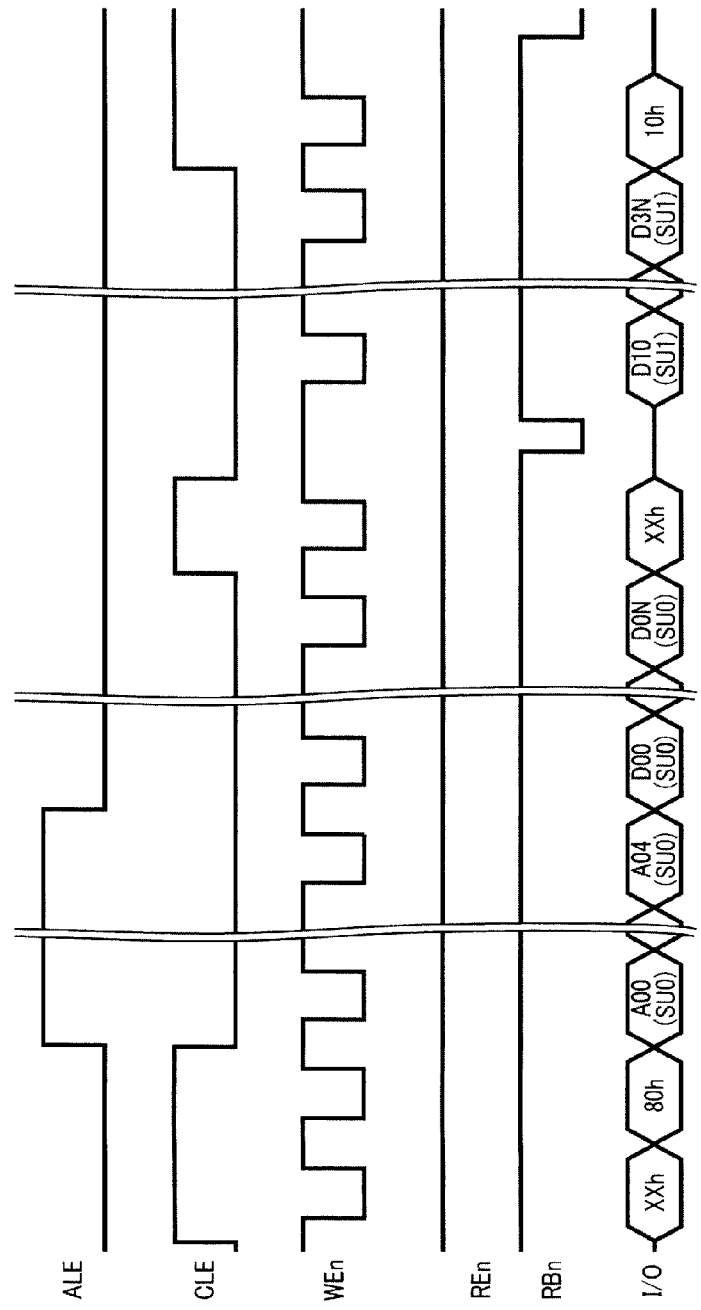

FOUR CELL UNIT INDIVIDUAL WRITING

FOUR CELL UNIT COLLECTIVE WIRING (WITH VERIFICATION)

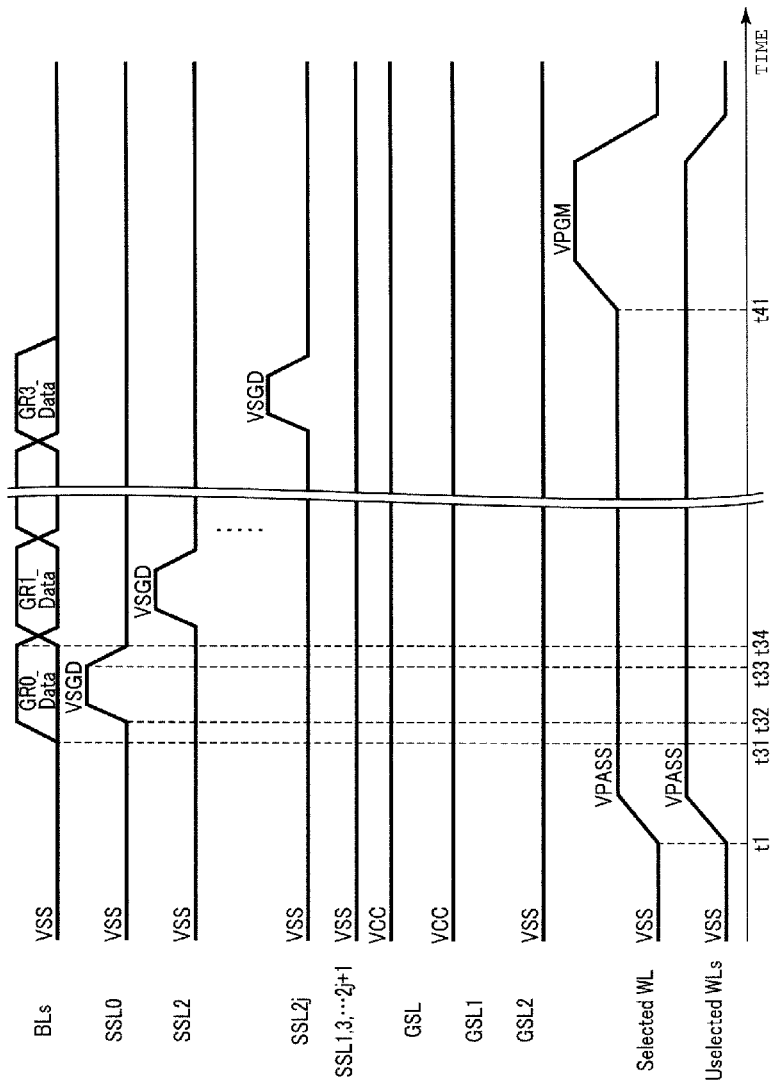

US 9,817,598 B2

MEMORY DEVICE CABLE OF HIGH WRITE EFFICENCY

CROSS-REFERENCE TO RELATED APPLICATION

This application is based upon and claims the benefit of priority from Japanese Patent Application No. 2016-043794, filed Mar. 7, 2016, the entire contents of which are incorporated herein by reference.

BACKGROUND

A memory device including memory cells that are arranged three-dimensionally is known.

DESCRIPTION OF THE DRAWINGS

FIG. 10 shows the details of address signals of the memory device according to the first embodiment.

FIG. 11 shows a data latch in the memory device and data retention by the data latch according to the first embodiment.

FIGS. 12A to 12C show, along the time axis, writing in the memory device according to the first embodiment and normal wiring.

FIG. 13 shows, along the time axis, another example of signals transmitted from the controller to the memory device during writing in the memory device according to the first embodiment.

FIG. 23 shows, along the time axis, potentials of several nodes during writing in the memory device according to the third embodiment.

DETAILED DESCRIPTION

Figure 1:
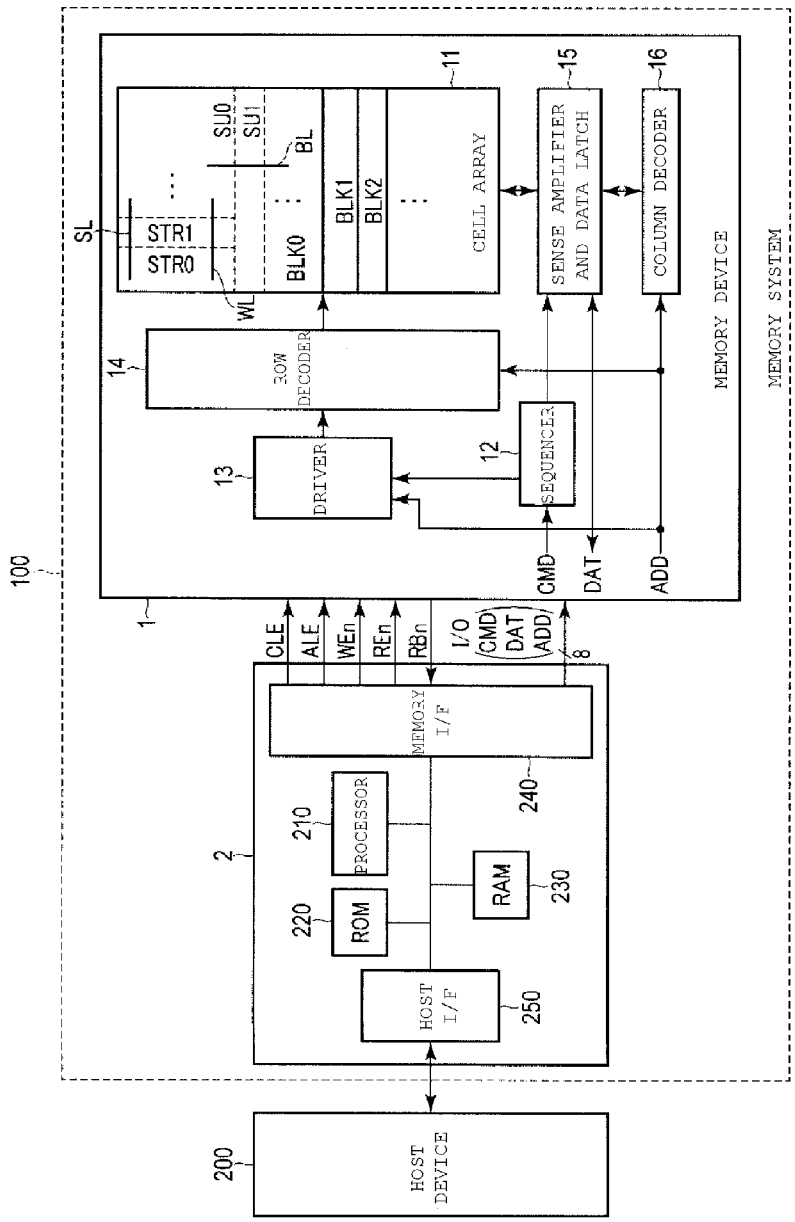
FIG. 1 shows a host device and a memory system including a memory device and a controller, according to a first embodiment.

According to an embodiment of the present invention, there is provided a memory device capable of high write efficiency.

In general, according to one embodiment, a memory device includes a first memory string including a first selection transistor and a first memory cell, a second memory string including a second selection transistor and a second memory cell, a bit line electrically connected to the first memory string and the second memory string, and a control circuit configured to perform a collective write operation on the first memory cell and the second memory cell by applying a voltage to turn on the first transistor, a voltage to turn on the second transistor, and then a program voltage at the same time to gates of the first and second memory cells.

Embodiments of the present invention will be described below with reference to the accompanying drawings. In the following description, the same reference numeral is used to denote substantially the same functions and configurations among different drawings, and repeated explanation thereof may be omitted. All of the descriptions of an embodiment are also applied to the descriptions of another embodiment, unless explicitly or obviously excluded. Each functional block may be achieved by either hardware or computer software, or the combination thereof. Each functional block is not necessarily required to be separated as in the following examples. For example, some functions may be executed by other functional blocks different from example functional blocks. Further, an example functional block may be further divided into smaller functional sub-blocks.

First Embodiment

As shown in FIG. 1, a memory system 100 according to a first embodiment includes a semiconductor memory device 1 and a memory controller 2. The memory system 100 communicates with a host device 200. The memory device 1 is, for example, a NAND type flash memory.

The memory controller 2 receives an instruction from the host device 200, and, based on the received instruction, controls the memory device 1. The memory controller 2 includes a processor 210 such as a CPU (central processing unit), and other elements including a ROM (read only memory) 220, a RAM (random access memory) 230, a memory interface 240 and a host interface 250.

When a program stored in the ROM 220 is executed by the processor 210, the memory controller 2 performs various operations. The RAM 230 stores temporary data. The memory interface 240 is connected to the memory device 1 and is responsible for communications between the memory controller 2 and the memory device 1. The host interface 250 is connected to the host device 200 through a bus and is responsible for communications between the memory controller 2 and the host device 200.

Using signals CLE, ALE, WEn, REn, RBn and I/O, the memory controller 2 controls the memory device 1 and learns about the state of the memory device 1. The signals CLE and ALE notify the memory device 1 that signals I/O flowing into the memory device 1 in parallel with the signals CLE and ALE are a command and an address, respectively. The signal WEn instructs the memory device 1 to accept the signal I/O flowing into the memory device 1 in parallel with the signal Wen as an input signal. The letter "n" at the end of the signal name means that the signal is valid when it is at low level. The signal REn instructs the memory device 1 to output the signal I/O. The signal RBn indicates whether the memory device 1 is in a ready state (a state in which the memory device 1 accepts an instruction from the memory controller 2) or in a busy state (a state in which the memory device 1 does not accept an instruction from the memory controller 2), and the low level indicates the busy state. The signal I/O has a width of 8 bits, for example, and includes a command (CMD), write data or read data (DAT), an address signal (ADD) and the like.

The memory device 1 includes circuit elements such as a memory cell array 11, a sequencer (controller) 12, a driver 13, a row decoder 14, a sense amplifier and data latch 15 and a column decoder 16.

The cell array 11 includes a plurality of blocks BLKs (BLK0, BLK1, ... ). For example, a block BLK is a unit of data erasure, such that data in each block BLK are erased together. However, data may be erased in a unit smaller than one block BLK (e.g., half of block BLK).

Each block BLK includes a plurality of string units (string groups) SUs (SU0, SU1, ... ). Each string unit SU includes a plurality of NAND strings STRs (STR0, STR1, ... ). Each string STR includes a plurality of memory cells (not shown). In the cell array 11, elements such as a word line WL, a bit line BL, a source line SL, a selection gate line (not shown) are also provided. Storage space including a plurality of memory cells forms one or more pages.

The sequencer 12 receives a command, and, according to a sequence based on the command, controls the driver 13 and the sense amplifier and data latch 15. The driver 13 receives a row address signal in an address signal ADD, and, based on the row address signal, supplies to the row decoder 14 various potentials applied to wirings such as the word line WL, the selection gate line and the source line SL. The driver 13 includes a plurality of drivers described later.

The row decoder 14 receives the row address signal, and, based on the row address signal, selects a block BLK. A potential from the driver 13 is transferred to the selected block BLK.

According to the control of the sequencer 12, the sense amplifier and data latch 15 reads out data from the memory cell and writes data into the memory cell. The sense amplifier and data latch 15 includes a plurality of data latches, for example, four data latches DL0, DL1, DL2 and DL3 (not shown). Each data latch can store data of one page. The data latch DL0 functions as a page buffer. Data transmitted to the memory device 1 is first received by the page buffer, and data transmitted from the memory device 1 is first received in and then transmitted from the page buffer.

The column decoder 16 receives a column address signal in the address signal ADD, and, based on the column address signal, selects a column and controls the sense amplifier and data latch 15.

Figure 2:
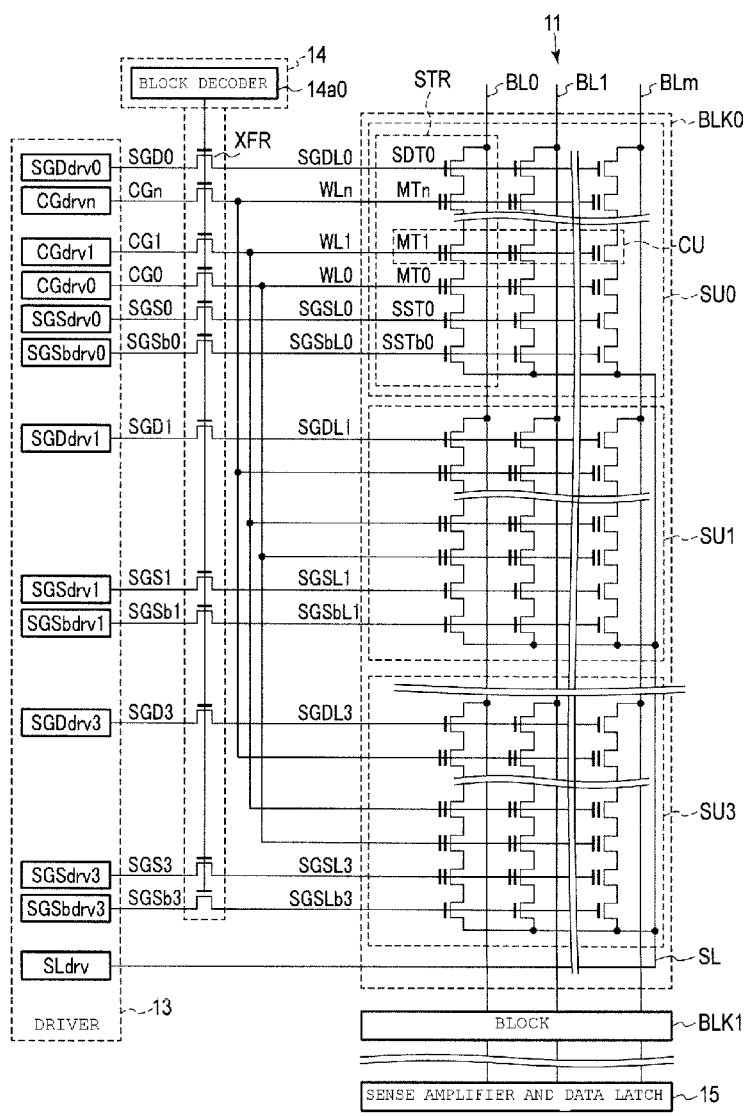
FIG. 2 shows elements and connections in a portion of a cell array of the memory device according to the first embodiment, and associated elements.

A portion of a cell array and associated elements are connected as shown in FIG. 2. Each block BLK includes string units SU0 to SUk. k is a natural number, and is 3 as an example in the following description.

Each of bit lines BL0 to BLm (m is a natural number) is connected to one string STR from each of four string units SU0 to SU3 in each block BLK.

Strings STRs each include selection gate transistors SSTbs (SSTb0 to SSTb3), selection gate transistors SSTs (SST0 to SST3), memory cell transistors MT0 to MTn and selection gate transistors SDTs (SDT0 to SDT3). The number n is a natural number. The transistors SSTb, SST, MT, SDT are connected in series in this order between the source line SL and one bit line BL. The cell transistor MT includes a control gate electrode (word line WL) and a charge storage film, and can store data in a nonvolatile manner based on the amount of charges in the charge storage film.

A set of strings STRs connected to each of different bit lines BLs forms one string unit SU. In each string unit SU, with respect to each x (x is a natural number equal to 0 or less than n), the gate of the cell transistor MTx is connected to the word line WLx. Further, in each block BLK, word lines WLxs in different string units SUs are also connected together. A set of cell transistors MTs sharing a word line WL in one string unit SU is named a cell unit CU.

With respect to each y (y is a natural number equal to 0 or less than k (=3)), transistors SDTy, SSTy and SSTby belong to a string unit SUy.

With respect to each y, the gate of each transistor SDTy in a plurality of strings STRs in the string unit SUy is connected to a selection gate line SGDLy. With respect to each y, the gate of each transistor SSTy in a plurality of strings STRs in the string unit SUy is connected to a selection gate line SGSLy. With respect to each y, the gate of each transistor SSTby in a plurality of strings STRs in the string unit SUy is connected to a selection gate line SGSbLy.

Selection gate lines SGSLs in a plurality of string units SUs in one block BLK are connected together. Selection gate lines SGSbLs in a plurality of string units SUs in one block BLK are connected together.

With respect to each x and y, in one selected block BLK, through the transistor XFR, the row decoder 14 connects the selection gate line SGDLy to an SG line SGDy, connects the selection gate line SGSLy to an SG line SGSy, connects the selection gate line SGSbLy to an SG line SGSby and connects the word line WLx to a CG line CGx. Therefore, the row decoder 14 includes one block decoder 14a (14a0) for each block BLK.

With respect to each y, the SG line SGDy is driven by a driver SGDdrvy, the SG line SGSy is driven by a driver SGSdrvy, and the SG line SGSby is driven by a driver SGSbdrvy. With respect to each x, the CG line CGx is driven by a driver CGdrvx. The source line SL is driven by a driver SLdrv.

According to the control by the sequencer 12, the drivers SGDdrv, SGSdrv, SGSbdrv, CGdrv and SLdrv apply various voltages to connected wirings during reading, writing or erasing of data.

Figure 3:
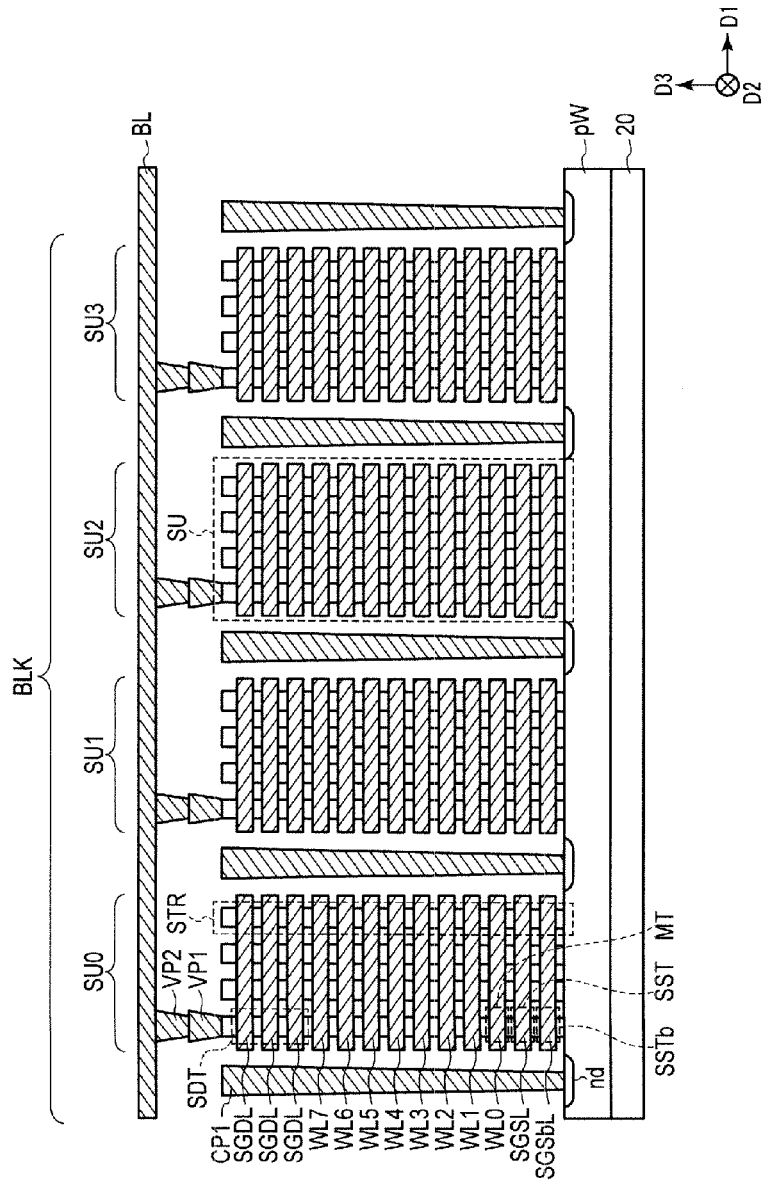
FIG. 3 shows a cross-section of the structure of a portion of the cell array of the memory device according to the first embodiment.
Figure 4:
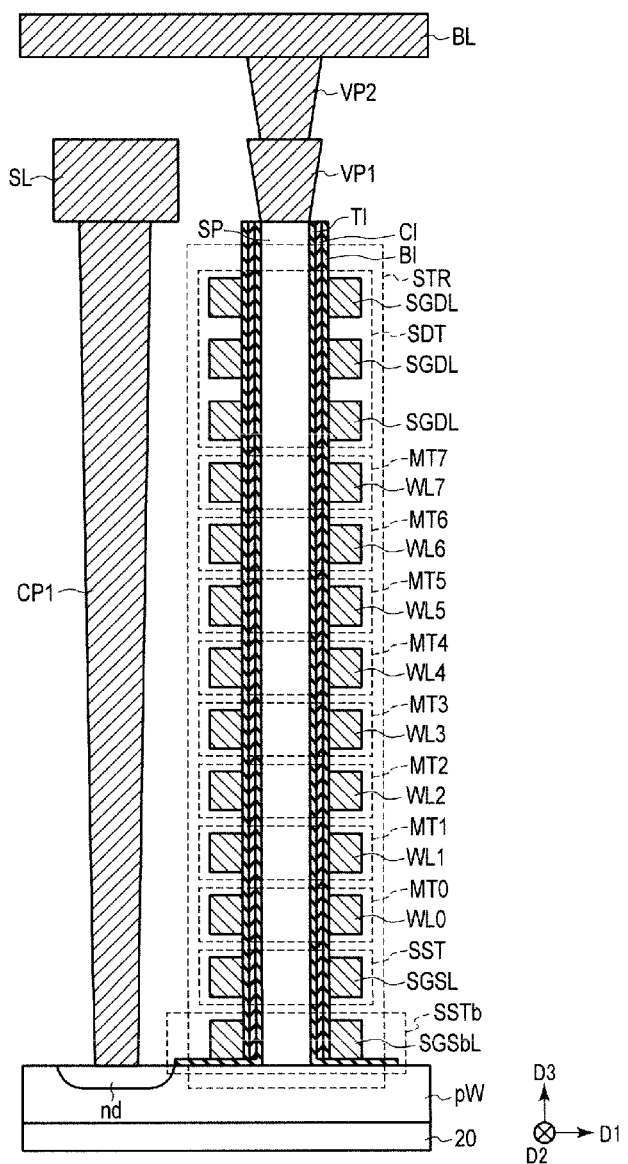
FIG. 4 shows a detailed cross-section of the structure of a portion of the cell array of the memory device according to the first embodiment.

For example, the cell array 11 has a structure shown in FIGS. 3 and 4. FIG. 3 shows an example of the cell array 11, and shows four string units SUs along an x-axis. FIG. 4 shows a portion of FIG. 3 in detail. FIGS. 3 and 4 show an example of n=7.

A p-type well region pW is provided on the surface of a substrate 20 and a semiconductor pillar SP is provided along the D3 axis on the well region pW. Side surfaces of the semiconductor pillar SP are covered with tunnel insulating film TI. Side surfaces of the tunnel insulating film TI are covered with charge storage film CI. The charge storage film CI is either insulating or conductive, and the side surface thereof is covered with block insulating film BI. The semiconductor pillar SP functions as a current path for the string STR, and provides a region where channels for the cell transistor MT and the selection gate transistors SDT, SST and SSTb are formed. The tunnel insulating film TI, the charge storage film CI and the block insulating film BI are shown only in FIG. 4.

On the upper portion in the well region pW, the conductive selection gate lines SGSbL and SGSL, a plurality of conductive word lines WLs (WL0 to WL7) and a plurality of conductive selection gate lines SGDLs are spread along the plane of D12. A plurality of selection gate lines SGDLs are connected together (not shown). The selection gate lines SGSbL and SGSL, a set of word lines WL0 to WL7 and a set of selection gate lines SGDLs are arranged to be spaced from each other along the D3 axis in this order. The selection gate lines SGSbL and SGSL, the word lines WLs and the selection gate lines SGDLs are each in contact with the block insulating film BI.

In the semiconductor pillar SP, the tunnel insulating film TI, the charge storage film CI and the block insulating film BI, a portion intersecting with the selection gate line SGSbL functions as a selection gate transistor SSTb, a portion intersecting with the selection gate line SGSL functions as a selection gate transistor SST, and a portion intersecting the word line WL functions as a cell transistor MT.

The transistors SSTb, SST, MT and SDT arranged along the D3 axis are transistors included in one string STR.

Bit lines BLs are provided above the upper portion of the semiconductor pillar SP. The bit lines BLs extend along the D1 axis, and are arranged to be spaced from each other along the D2 axis. One bit line BL is connected to the upper ends of a plurality of strings STRs through plugs VP1 and VP2.

A plurality of strings STRs are provided at different positions along the D2 axis. Such a plurality of strings STRs provided at the different positions along the D2 axis are strings STRs included in the string unit SU.

Herein, strings STRs, which are not connected with the bit line BL depicted in a plane of FIG. 3, are actually located in planes different from the plane depicted in FIG. 3 (at positions along the D2 axis different from that shown in FIG. 3.

In each string unit SU, selection gate lines SGDLs, word lines WLs and selection gate lines SGSL and SGSbL surround the block insulating film BI on the side surfaces of all the semiconductor pillars SP of that string unit SU.

In the region on the surface of the well region pW, an n$^+$ type impurity diffusion layer nd is further provided. The diffusion layer nd is connected to the lower end of a contact plug CP1. The contact plug CP1 extends along a plane formed by the D2 axis and the D3 axis. The upper end of the contact plug CP1 is connected to the source line SL. The source line SL is omitted in FIG. 3.

Examples configurations of the cell array 11 include those described in U.S. Patent Application Publication No. 2009/0267128, entitled "Three dimensional stacked nonvolatile semiconductor memory," U.S. Patent Application Publication No. 2009/0268522, entitled "Three dimensional stacked nonvolatile semiconductor memory," U.S. Patent Application Publication No. 2010/0207195, entitled "Non-volatile semiconductor storage device and method of manufacturing the same," and U.S. Patent Application Publication No. 2011/0284946, entitled "Semiconductor memory and method for manufacturing same". The entire contents of these patent applications are incorporated herein by reference.

Figure 5:
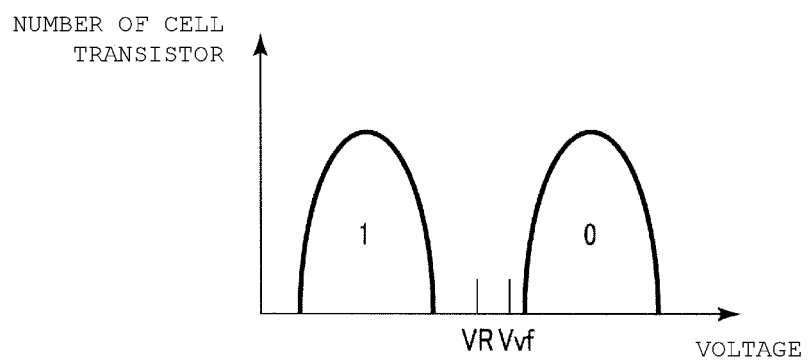
FIG. 5 shows the distribution of the threshold voltage of a cell transistor in which data is written in the memory device according to the first embodiment.

The memory device 1 can hold one or bits of data in one cell transistor MT. FIG. 5 shows the distribution of the threshold voltages of cell transistors MTs, in which one bit of data is written per cell transistor. As a result of writing, the threshold voltage of each cell transistor MT has a level depending on the data held therein. Even if a plurality of cell transistors MTs hold the same data, the cell transistors MTs may have different threshold voltages from one another. Therefore, the threshold voltages of a plurality of transistors MTs holding the same data form one distribution. A cell transistor MT holding "0" data has an electron injected into the charge storage film CI, and has a threshold voltage higher than threshold voltages of any of the cell transistors MTs holding "1" data. A cell transistor MT holding "1" data does not have an electron injected into the charge storage film CI, and is in an erased state.

The reading of data held in a cell transistor MT is carried out based on the determination which distribution the threshold voltage of this cell transistor MT belongs to. The determination of the distribution is performed using a read voltage VR that is between two distributions. When a cell transistor MT having a threshold voltage equal to or higher than the read voltage VR receives the read voltage VR, it is kept off. On the other hand, when a cell transistor MT having a threshold voltage less than the read voltage VR receives the read voltage VR, it is turned on. Voltage Vvf is used for verification, and is higher than the read voltage VR. Verification refers to confirmation of whether, after the injection of an electron into the charge storage film CI for a cell transistor MT to be written, the cell transistor MT has reached a target threshold voltage. When it is determined that the cell transistor MT has a higher threshold voltage than the voltage Vvf based on the verification after injection of an electron into the charge storage film CI, the cell transistor MT is determined to have entered into a state in which it holds "0" data.

(Operation)

Figure 6:
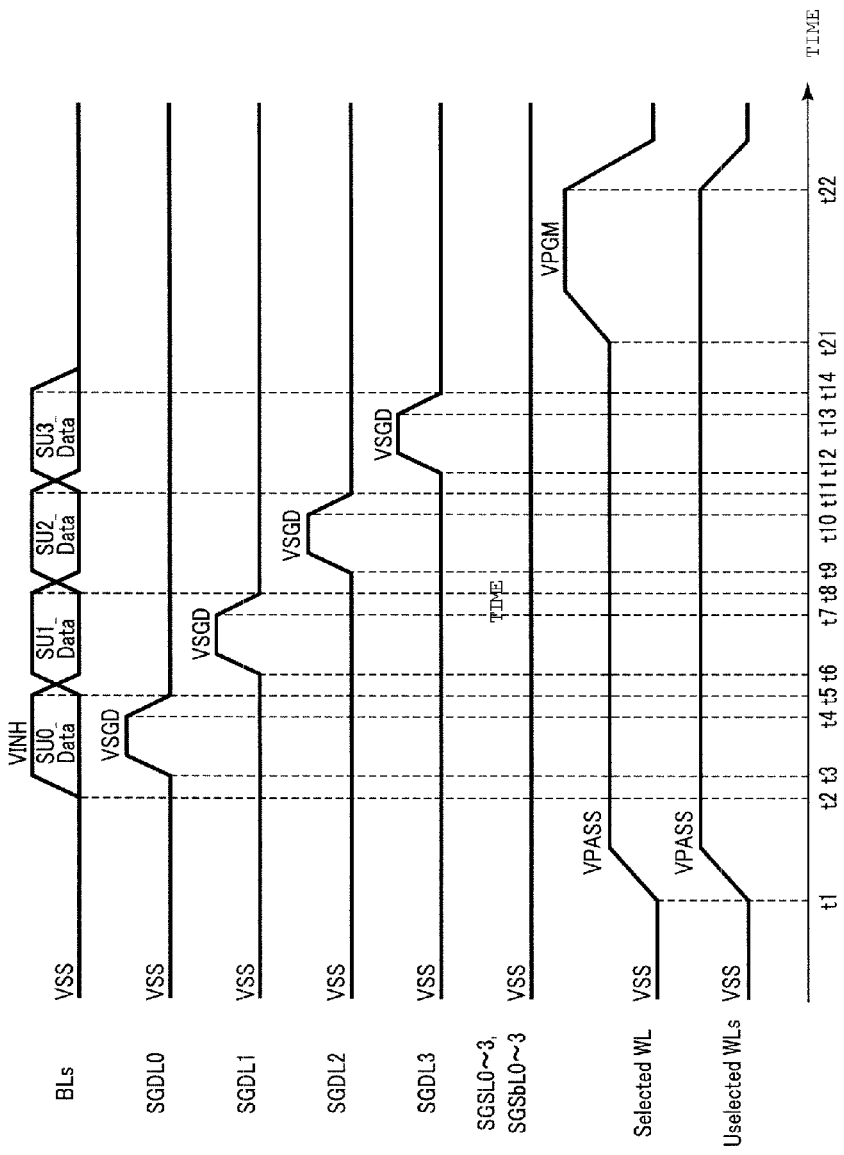
FIG. 6 shows, along the time axis, potentials of several nodes during writing in the memory device according to the first embodiment.

Referring now to FIG. 6, the writing in the memory device according to the first embodiment will be described. FIG. 6 shows, along the time axis, potentials of several nodes in one selected block BLK during writing in the memory device 1.

The potential of a bit line BL, as illustrated, indicates both of a bit line BL connected to a string ("0" write string) STR including a cell transistor MT into which "0" data is written, and a bit line BL connected to a string ("1" write string) STR including a cell transistor MT into which "1" data is written. During the writing, one bit of data is written per cell transistor MT connected to the selected word line; for example, data of one page is written into one cell unit CU.

As shown in FIG. 6, at the time of the start of writing, the sequencer 12 applies ground potential VSS (=0) to all bit lines BLs, all selection gate lines SGDL0 to SGDL3 and all word lines WLs in the selected block BLK. Therefore, all selection gate transistors SDT0 to SDT3 are off. In addition, during writing, the sequencer 12 maintains all of the selection gate lines SGSL0 to SGSL3 and SGSbL0 to SGSbL3 to a potential VSS, and therefore, the selection gate transistors SST0 to SST3 and SSTb0 to SSTb3 remain off.

At the time t1, the sequencer 12 applies a potential VPASS to all the word lines (selected word lines and all unselected word lines) WL. A selected word line WL is a word line WL that is identified by a row address signal for writing, and an unselected word line WL is a word line WL other than a selected word line WL. The potential VPASS has such a magnitude that in a "0" write string STR, writing into the cell transistor (selected cell transistor) MT connected to the unselected word line WL is inhibited, while, in a "1" write string STR, a channel can be increased in the potential by a coupling to the extent that the rise in the threshold voltage of the selected cell transistor MT can be inhibited.

At the time t1, all selection gate transistors SDT0 to SDT3 are off. Therefore, by the application of the potential VPASS, the channels for all the strings STRs in the selected block BLK are uniformly increased (boosted) to the potential VPASS, or to a potential having a magnitude close to the potential VPASS.

From the time t2, the sequencer 12 applies to the bit line BL a potential corresponding to the data SU0_Data to be written into a cell unit (selected cell unit) CU connected to the selected word line WL in the string unit SU0. Specifically, the potential VSS is applied to a bit line BL connected to a "0" write string ("0" write bit line). On the other hand, the potential VINH is applied to a bit line BL connected to a "1" write string ("1" write bit line). The potential VINH is higher than the potential VSS, and has a magnitude close to the magnitude of the potential VPASS, for example.

The sequencer 12 applies a potential VSGD to the selection gate line SGDL0 from the time t3 to time t4. The potential VSGD is higher than the potential VSS, and has such a magnitude that a selection gate transistor SDT_0 connected to a "0" write bit line BL is kept on, while a selection gate transistor SDT_0 connected to a "1" write bit line BL is turned off. By the application of the voltage VSGD, the selection gate transistor SDT_0 connected to the "0" write bit line BL is turned on. As a result, the channel for the "0" write string STR0 is connected to the "0" write bit line BL, and enters a state in which the potential VSS is applied. On the other hand, even by the application of the voltage VSGD, the selection gate transistor SDT_0 connected to the "1" write bit line BL is kept off. As a result, the channel for the "1" write string STR0 is disconnected from the "1" write bit line BL, and is in an electrical floating state.

At the time t5, the sequencer 12 stops the application of a potential to the bit line BL from the time t2. Thus, while a potential corresponding to the data SU0_Data is being applied to the bit line BL, the potential VSGD is applied to the gate of the corresponding transistor SDT0, the "0" write string STR in the string unit SU0 is connected to the bit line BL, and the "1" write string is disconnected from the bit line BL.

From the time t5, the sequencer 12 applies a potential to each of the string units SU1 to SU3 in the same manner as in the string unit SU0 from the time t2 to the time t5. That is, from the time t5 to the time t8, a potential corresponding to data SU1_Data to be written into a selected cell unit CU in the string unit SU1 is applied to a bit line BL, and from the time t6 to the time t7, the potential VSGD is applied to the selection gate line SGDL1. Further, from the time t8 to the time t11, a potential corresponding to data SU2_Data to be written into a selected cell unit CU in the string unit SU2 is applied to a bit line BL, and from the time t9 to the time t10, the potential VSGD is applied to the selection gate line SGDL2. Furthermore, from the time t11 to the time t14, a potential corresponding to data SU3_Data to be written into a selected cell unit CU in the string unit SU3 is applied to a bit line BL, and from the time t12 to the time t13, the potential VSGD is applied to the selection gate line SGDL3.

Each of the string units SU0 to SU3 may be connected to a bit line BL while a potential corresponding to the write data is applied to the bit line BL in an order different from the example of FIG. 6. Further, only some of the string units SUs in one block BLK may have the potential corresponding to the write data be applied to a bit line BL and the "0" write string STR be connected to the bit line BL.

At the time t21, the sequencer 12 applies a potential VPGM to the selected word line WL. The potential VPGM is higher than the potential VPASS. At the time t22, the sequencer 12 returns the potentials in the selected word line WL and the unselected word line WL to the potential VSS.

Figure 7:
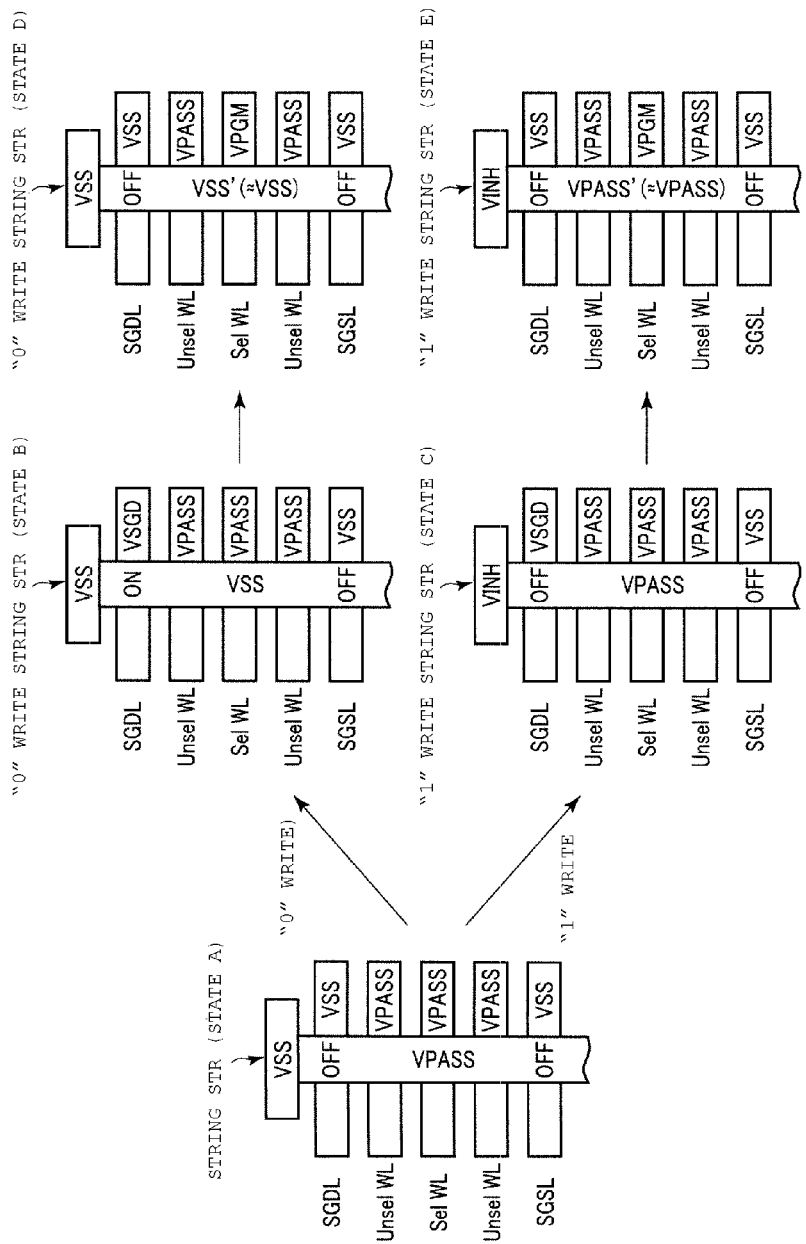
FIG. 7 shows several states of strings during writing in the memory device according to the first embodiment.

Referring now to FIG. 7, the various states of the string STR resulting from the application of a potential in FIG. 6 will be described. FIG. 7 sequentially shows several states of strings STRs during writing in the memory device 1. In FIG. 7, the display of the selection gate line SGSbL is omitted. As described above, during writing, the selection gate line SGSbL receives a potential VSS, and therefore, the transistor SSTb is turned off. Further, FIG. 7 representatively shows only a selected word line WL (Sel WL) and two unselected word lines (Unsel WL).

A state A in FIG. 7 shows the state of a string STR from the time t1 to the time t2 in FIG. 6. All strings STRs in all string units SUs are in the state A. In all the strings STRs, since the selection gate lines SGDLs (SGDL0 to SGDL3) and SGSLs (SGSL0 to SGSL3) have a potential VSS, the channels for all the strings STRs are electrically floating. Then, since all the word lines WL have the potential VPASS, the channels for all the strings STRs receive a boost by a coupling so as to have a potential having substantially the same magnitude as that of the potential VPASS.

States B and C show a state of a string STR in a string unit SU0 from the time t3 to the time t4 in FIG. 6. The state B indicates a state of the "0" write string STR, and a state C indicates a state of the "1" write string STR.

The bit line BL connected to the "0" write string STR (i.e., "0" write bit line) has a potential VSS, and the bit line BL connected to the "1" write string STR (i.e., "1" write bit line) has a potential VINH. In this state, by the application of the potential VSGD to the selection gate line SGDL (SGDL0), the selection gate transistor SDT (SDT0) in the "0" write string STR is turned on, and the "0" write string STR in the string unit SU (SU0) is electrically connected to the corresponding bit line BL. As a result, an electron flows into the "0" write string STR from the connected bit line BL, and the potential of the channel becomes substantially equal to the potential VSS of the bit line BL. On the other hand, even by the application of the potential VSDG, "1" write string STR in the string unit SU (SU0) is disconnected from the corresponding bit line BL. As a result, in the "1" write string STR, the boost of the channel is maintained, and the channel continues to have the potential VPASS. Thus, in the channel in the "0" write string, the boost is released, and in the "1" write string, the boost is maintained.

The state B and the state C also correspond to the state of the string STR in the string unit SU1 from the time t6 to the time t7 in FIG. 6, the state of the string STR in the string unit SU2 from the time t9 to the time t10, and the state of the string STR in the string unit SU3 from the time t12 to the time t13. Thus, in each string unit SU, in the "0" write string, the boost of the channel is released, and in the "1" write string, the boost of the channel is maintained.

States D and E show a state from the time t21 to the time t22 in FIG. 6. In all the string units SUs, the "0" write string STR has the state D, and the "1" write string STR has the state E. Since each of the selection gate lines SGDLs (SGDL0 to SGDL3) in all the strings STRs has a potential VSS, the transistors SDTs (SDT0 to SDT3) are off. Therefore, the channels for all the strings STRs are electrically floating. And, the selected word line WL has the potential VPGM, and the unselected word line WL has the potential VPASS. Accordingly, the channel for the string STR is boosted by a capacitive coupling with the word line WL. The potential of the channel in the state D is based on the potential of the channel in the state B, and there is a difference between the potentials of the selected word line WL in the state B and the state D. Similarly, the potential of the channel in the state E is based on the potential of the channel in the state C, and there is a difference between the potentials of the selected word line WL in the state C and the state E. That is, the channel in the state D is boosted from the state of the channel in the state B, and the channel in the state E is boosted from the state of the channel in the state C, by a magnitude based on the difference between the potential VPGM and the potential VPASS of the selected word line WL. Specifically, the boost according to the difference between the potential VPGM and the potential VPASS of the selected word lines WLs which is divided by the number of cell transistors MT ((VPGM−VPASS)/(n+1)) is added to the potentials of the channels in the state B and the state C.

As an example, assuming that the potential VPGM is 20V, the potential VPASS is 7 V, and n is 63, the potential of the channel in the state D is VSS+about 0.2 V, which is a potential VSS' almost equal to the potential VSS. On the other hand, the potential of the channel in the state E is about VPASS+0.2V, which is a potential VPASS' almost equal to the potential VPASS. Thus, in the "0" write string STR, a large potential difference is formed between the selected word line WL and the channel, and in the "1" write string STR, only a small potential difference is formed between the selected word line WL and the channel. Therefore, in the "0" write string STR, writing is performed (an electron is injected), and in the "1" write string STR, writing is not performed. Such writing is performed in all the string units SU0 to SU3 simultaneously. As a result, by the application of a program potential VPGM, the data having the magnitude of the same number of pages (4 in the current example) as the number of the strings units SUs may be collectively written into the cell unit CU of the word line WL having the same address.

Figure 8A:
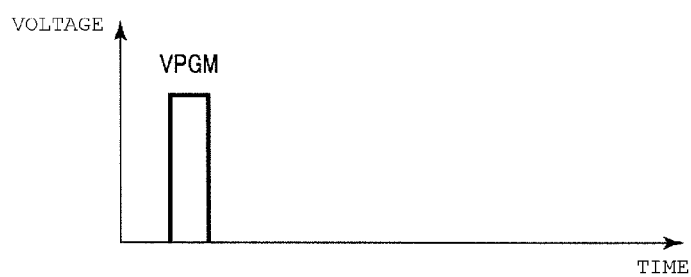
FIGS. 8A and 8B each show a potential applied to a selected word line during writing in the memory device according to the first embodiment.
Figure 8B:
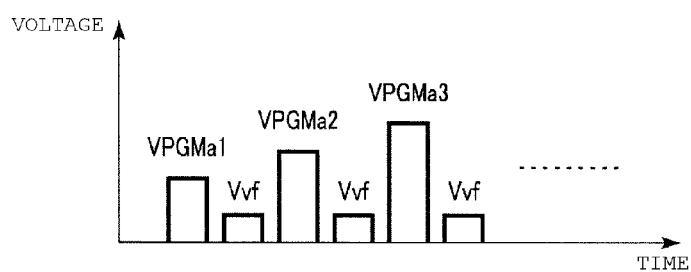

Normal writing is also possible in the memory device 1, in addition to the collective writing into a plurality of string units SUs (hereinafter, referred to as collective writing) as shown in FIG. 6. Normal writing includes applying a program potential VPGM for each string unit SU. Collective writing is different from normal writing on several points. Hereinafter, differences will be described with reference to FIGS. 8A and 8B. FIG. 8A shows an example potential applied to a selected word line during collective writing according to the first embodiment. FIG. 8B shows an example potential applied to a selected word line during normal writing. First, normal writing will be briefly described.

In the normal writing, as shown in FIG. 8B, the memory device 1 applies a plurality of program potentials VPGMa1, VPGMa2, . . . to the selected word line WL while increasing the program potentials. The potential VPGMa1 which is first applied is higher than the potential VPASS. In addition, in the normal writing, after applying each of the program potentials VPGMa1, VPGMa2, . . . , the memory device 1 applies verify voltage Vrf to the selected word line WL to perform verification. The memory device 1 applies potentials VSS and VINH to the "0" write bit line BL and the "1" write bit line BL, respectively, and applies the potential VSGD to the selection gate transistor SDT in the string unit SU including the selected cell unit CU. Then, while such a potential is being applied, the sequencer 12 applies the potential VPASS to the unselected word line WL, and applies the potential VPGMa1 to the selected word line WL. In addition, verification including the application of the potential Vvf, is performed. Then, the potential VPGMa2 higher than the potential VPGM1a is applied, and so forth. Such a set (loop) of application and verification of the program potentials VPGMa1, VPGMa2, . . . and the potential VPASS while the potentials VSS and VINH are being applied to the bit line BL is repeated to one string unit SU, until the verification is passed. Hereinafter, the writing into each selected string unit is referred to as individual writing. The individual writing is one of the characteristics of the normal writing.

On the other hand, in the collective writing, as shown in FIG. 8A, the program voltage VPGM is greater than the first potential VPGMa1 in the normal writing. Further, the program voltage VPGM has such a magnitude that can exceed the verify voltage Vrf with high accuracy (e.g., surely) by a single application of the program potential VPGM in the cell transistor MT into which "0" data is written. This allows verification to be omitted in the collective writing.

The collective writing is used, for example, when the supply of power to the host device 200 having data which has not yet been written into the memory device 1 is stopped unexpectedly. In such a case, the host device 200 wishes to write the unwritten data into the memory device 1 in an extremely short time, in order to prevent loss of the unwritten data in the RAM or buffer in the host device 200. As will be described below in detail, the collective writing ends in a shorter time than the individual writing because the number of the applications of the program potentials is reduced. Therefore, as described above, when power supply is stopped abruptly, as emergency measures, the host device 200 performs collective writing. On the other hand, the host device 200 usually performs normal writing.

Figure 9:
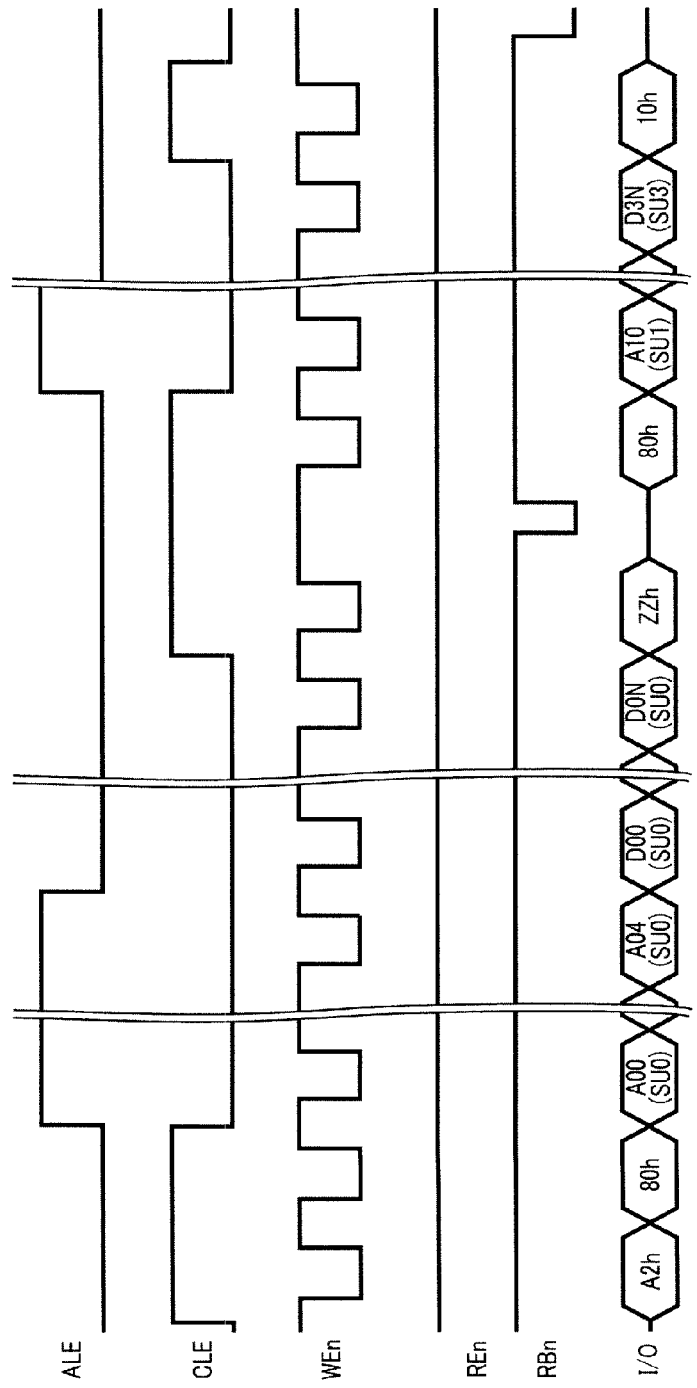
FIG. 9 shows, along the time axis, signals transmitted from the controller to the memory device during writing in the memory device according to the first embodiment.

In the example illustrated above, the memory device 1 is required to have already received each data to be written simultaneously, the data of four pages, before starting applying a potential to a relevant element for writing. The operation therefor will now be described. Specifically, with reference to FIG. 9, the operation of the memory controller 2 for causing the memory device 1 to perform the operations of FIGS. 6 and 7 will be described. FIG. 9 shows, along the time axis, signals transmitted from the memory controller 2 to the memory device 1 during writing in the memory device 1 according to the first embodiment.

As shown in FIG. 9, the memory controller 2 transmits a command A2h and a write command 80h to the memory device 1. The write command 80h gives an instruction to perform normal writing, that is, writing including applying a program potential individually for each string unit SU. However, when the command A2h is followed by the subsequent write command 80h, the command instructs the memory device 1 to perform collective writing. The memory device 1 recognizes that the successive commands A2h and 80h instruct the collective writing.

Following the command 80h, the memory controller 2 transmits address signals A00 to A04 to the memory device 1. For example, the address signals are transferred, for example, in 5 cycles. The address signals A00 to A04 designate a selected word line WLi in the string unit SU0 (i is a natural number equal to or higher than 0 and less than n). The transmission of the address signals A00 to A04 in 5 cycles is based on an example in which the controller 2 and the memory device 1 transmit and receive a signal I/O having width of 8 bits. An example of an address signal is shown in FIG. 10. FIG. 10 shows the details of address signals of the memory device 1 according to the first embodiment. Each of I/O0 to I/O7 in the figure transfers one bit of data. Accordingly, FIG. 10 is based on the example of the transmission of 40 bits in total of address signals from a0 to a39.

As shown in FIG. 10, I/O0 to I/O7 in a first input cycle and I/O0 to I/O6 in a second input cycle (a0 to a14) transfer column address signals. One column is equivalent to 15 bits.

I/O0 to I/O1 in the third input cycle (a16 to a17) transmit string address signals. The string address signals designate a string to be accessed. Further, I/O2 to I/O7 in a third input cycle (a18 to a23) transmit word line address signals. The word line address signals designate a word line WL to be accessed. The string address signal and the word line address signal form a row address signal.

I/O0 in a fourth input cycle (a24) transmits a plane address signal. The plane address signal designates a plane to be accessed when the memory device 1 has a plurality of planes. One plane includes a set of the memory cell array 11, the sense amplifier and data latch 15, the column decoder 16, and the row decoder 14.

I/O1 to I/O7 in the fourth input cycle and I/O0 to I/O3 in a fifth input cycle (a25 to a35) transmit block address signals. The block address signals designate a block BLK to be accessed. I/O4 to I/O6 in the fifth input cycle (a36 to a38) transmit a chip address signal. The chip address signal designates a memory device 1 to be accessed when the memory system 100 includes a plurality of memory devices 1.

Returning to FIG. 9, following the address signal A04, the memory controller 2 transmits to the memory device 1, data D00 to D0N (N is a natural number) to be written into the selected cell unit CUi in the string unit SU0. Then, the memory controller 2 transmits a command ZZh to the memory device 1. The command ZZh instructs to suspend the writing of the write data into the memory cell MT although the transmission of the write data is completed, and indicates that an additional write command follows, for example. When the command ZZh is received by the memory device 1, the memory device 1 becomes a busy state for a short time.

When the memory device 1 returns to the ready state, the memory controller 2 transmits the set of a command and data for the string unit SU1 in a similar manner as the string unit SU0. In other words, the memory controller 2 transmits the command 80h, the address signals A10 to A14, the data D10 to D1N and the command ZZh. The address signals A10 to A14 designate a selected word line WLi.

Similarly, the memory controller 2 transmits to the memory device 1, a similar set of a command and data for the string unit SU2 as the set of the command and data for the string units SU0 and SU1. The address signals A20 to A24 for the string unit SU2 designate a selected word line WLi. In addition, the memory controller 2 transmits the command 80h, the address signals A30 to A34 and the data D30 to D3N for the string unit SU3. The address signals A30 to A34 for the string unit SU3 designate a selected word line WLi. Since the transfer of four pages of data to be collectively written is completed, the memory controller 2 transmits a write instruction command 10h to the memory device 1 after transmitting the data D3N. When the memory device 1 receives the command 10h, the memory device 1 performs the operations shown in FIGS. 6 and 7.

The memory device 1 holds in the data latch, the data to be collectively written that has been received until the command 10h is received. The write data is first received by the page buffer DL0, and is transferred to any one of the data latches DL1, DL2 and DL3. Then, based on the data in the data latch DL1, DL2 or DL3, the string STR in the corresponding string unit SU is in the state B and the state C in FIG. 7. Hereinafter, the state B and the state C are referred to as a writable state and a write protected state. After being set to a writable state or a write protected state depending on write data, the write data may not be held in any of the data latches DL1, DL2 and DL3. This is because, as described above, no verification is performed, and there is no need to hold write data to be compared with the result of the verification. Accordingly, the data latches DL1, DL2 and DL3 holding data that is no longer needed may hold another write data.

In this manner, three data latches DL1, DL2 and DL3 are used and the data latch holding data that is no longer needed is reused, and, at the same time, the state of the string STR is set to a state based on the data collectively written. More specifically, for example, as shown in FIG. 11 the data Data0 to Data 2 are sequentially transferred to the data latches DL1, DL2 and DL3 from the page buffer DL0. The data Data0 to Data2 are the data for, for example, the string units SU0 to SU2, and are sequentially transferred to the cell array 11. At the time when the data Data3 (e.g. for the string unit SU3) is received by the page buffer DL0, if the data Data0 is no longer needed, the data Data3 is held in the data latch DL1. Otherwise, the data Data3 is held in the latch DL1 at the time when the data Data0 is no longer needed.

(Advantage (Effect))

FIG. 12A shows the normal writing of four pages along the time axis, and shows the individual writing of four pages with verification. Based on the reception of four write commands by the memory device 1, as shown in FIG. 12A, a set of writing (W) and verification (V) is performed for each page. It takes 40 μs to perform writing, for example, and it takes 50 μs to perform verification, for example. Based on an example of these numeric values, it takes (40 μs+50 μs)×4=360 μs to complete the individual writing of the four pages with verification.

According to the first embodiment, in each of the string units SU0 to SU3, each of strings STRs in each of the string units SUs is sequentially set to a writable state or a write protected state, and, by the application of the program potential VPGM, data is collectively written into the string units SU0 to SU3 containing the strings STRs in which the state has been already set. Verification is omitted as described above; as a result, the time required for writing is as follows. It takes 40 μs to set strings STRs in one string unit SU to a writable state or a write protected state, and apply the program potential VPGM, and it takes 10 μs to set strings STRs in each of the second and subsequent string units SUs to a write enable state or a write protected state. Based on an example of these numeric values, it takes 40 μs+10 μs×3=70 μs to perform writing as shown in FIG. 12B. On the other hand, for comparison purposes, when only the write time shown in FIG. 12A is extracted, it takes 40 μs×4=160 μs as shown in FIG. 12C. Thus, when FIG. 12B of the first embodiment is compared with FIG. 12C, it takes 70 μs/160 μs=44% of the time required in FIG. 12C to complete writing of data of four pages.

Further, according to the first embodiment, the program voltage VPGM is higher than the first program potential VPGMa1 for the normal writing, and has such a magnitude that may exceed the verify voltage Vrf in all the cell transistors MTs into which the "0" data is written, for example, by the application of the first program potential VPGM to the selected word line WL. For the writing according to the first embodiment, writing is performed such that one bit of data per cell transistor MT is held as described above. Therefore, there is only one threshold distribution of the cell transistor MT into which an electron is injected by writing. Therefore, the writing is successful when the threshold voltage of the cell transistor MT into which "0" data is to be written exceeds the verify voltage Vf. Then, according to the first embodiment, the program voltage VPGM is set to have such a magnitude that may exceed the verify voltage Vrf in all the cell transistors MTs into which the "0" data is written by the application of the first program potential VPGM to the selected word line WL. Therefore, a cell transistor MT into which lots of (for example, all of) "0" data is written enters a state in which it holds "0" data. That is, even if verification is omitted, it is possible to perform writing into a larger number of cell transistors MTs.

Further, by the omission of verification, the memory device 1 has no need to have a large number of data latches, and three latches and the page buffer DL0 will suffice in order to perform collective writing into four string units SUs.

(Modification)

The memory device 1 accepts collective writing by a transmission different from the transmission of a command, an address signal and data, shown in FIG. 9. FIG. 13 shows, along the time axis, another example of signals transmitted from the controller 2 to the memory device 1 during writing in the memory device 1 according to the first embodiment.

As shown in FIG. 13, the memory controller 2 first transmits a command XXh and a write command 80h to the memory device 1. In this example, the command XXh functions as a prefix, and the command XXh followed by the subsequent command 80h gives an instruction of (address abbreviated type) collective writing in which an address signal for each string unit SU is omitted. The memory device 1 recognizes that the successive commands XXh and 80h instruct the address abbreviated type collective writing.

Following the command 80h, the memory controller 2 transmits to the memory device 1, out of the multiple string units SUs targeted for the address abbreviated type collective writing, the address signals A00 to A04 in the string unit SU (for example, SU0) having the smallest address, and the data D00 to D0N to be written into the selected cell unit CUi in the string unit SU0. Then, the memory controller 2 transmits the command XXh to the memory device 1. The command XXh, when used alone, indicates that the transmission of the write data for a certain string unit SU is completed, and the transmission of the write data for the next string unit SU is followed. Upon receiving the command XXh, the memory device 1 recognizes that subsequent data should be written into the selected cell unit CUi in the string unit SU (e.g. SU1) having an address that is incremented by one. When the command XXh is received by the memory device 1, the memory device 1 becomes a busy state for a short time.

When the memory device 1 returns to a ready state, the memory controller 2 does not transmit address signals A10 to A1N for the string unit SU1, but transmits to the memory device 1, data D10 to D1N to be written into the string unit SU1. In this manner, the memory controller 2 does not transmit an address signal, prior to the transmission of the data for the second and subsequent string units SUs. In the collective writing (also including address abbreviated type), it is used that the designation of the word line WL may be omitted since word lines WLs having the same address are designated to different string units SUs. On the other hand, by the omission of the transmission of the address signals, in all of the second and subsequent string units SUs, a column address 0 is designated.

Then, the memory controller 2 transmits the command XXh and data D20 to D2N for the string unit SU2, and transmits the command XXh and data D30 to D3N for the string unit SU3. Since the transfer of four pages of data to be collectively written is completed, the memory controller 2 transmits a write instruction command 10h to the memory device 1 after transmitting the data D3N. When the memory device 1 receives the command 10h, the memory device 1 performs the operations shown in FIGS. 6 and 7.

The modification also provides the advantages of the first embodiment. Furthermore, according to the modification, since the transmission of the address signal for the second and subsequent string units SUs is omitted, the writing time is made shorter than that of the collective writing that is not of the address abbreviated type.

Second Embodiment

In a second embodiment, verification is performed.

To perform verification, data needs to be held in any one of the data latches DL1, DL2 and DL3 until the verification is passed after it has been written into the cell array 11. Therefore, according to the second embodiment, data is collectively written into a smaller number of string units SUs than that in the first embodiment. As in the first embodiment, based on an example in which there are four elements in total including the page buffer DL0, and the data latches DL1, DL2 and the DL3, data can be collectively written into two string units SUs.

Figure 14:
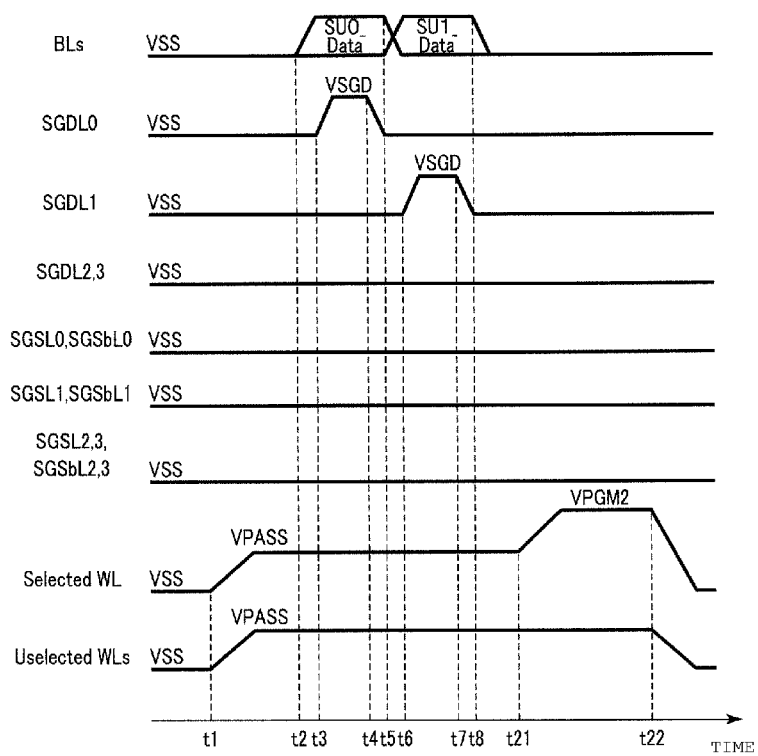
FIG. 14 shows, along the time axis, potentials of several nodes during writing in a memory device according to a second embodiment.
Figure 15:
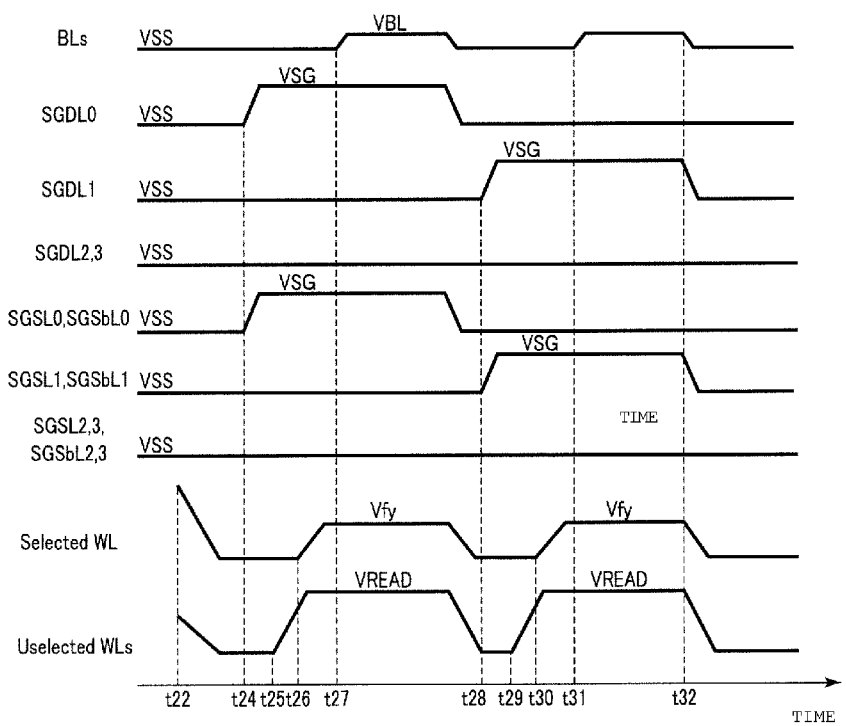
FIG. 15 shows, along the time axis, potentials of several nodes at the time subsequent to FIG. 14.

FIGS. 14 and 15 show, along the time axis, potentials of several nodes during writing in the memory device 1 according to the second embodiment. As shown in FIG. 14, after the time t8, at the time t21, the sequencer 12 applies the potential VPGM2 to the selected word line WL. At the time t22, the sequencer 12 returns the potentials of the selected word line WL and the unselected word line WL to the potential VSS. During writing, the potentials of the selection gate lines SGDL2 and SGDL3 in the unselected string units SU2 and SU3 remain the potential VSS. The potential VPGM2 may be the same as the potential VPGM of the first embodiment, or may be smaller than the potential VPGM, and may be the same as, for example, the program potential of the normal writing (any of the program potentials VPGMa1, VPGMa2, VPGMa3 . . . in FIG. 8B).

Then, as shown in FIG. 15, from the time t24, the sequencer 12 sequentially performs verification on the string units SU0 and SU1 where writing is performed. For example, the sequencer 12 first performs the verification of the string unit SU0. To that end, the sequencer 12 applies a potential VSG to the selection gate lines SGDL0, SGSL0 and SGSbL0 from the time t24. The potential VSG is higher than the potential VSGD, and has such a magnitude that causes the transistors SST, SSTb and SDT to be turned on. Further, the sequencer 12 applies the potential VREAD to the unselected word lines WL from the time t25, and applies verify voltage Vvf to the selected word line WL from the time t26. The potential VREAD is set to have such a magnitude that causes the cell transistor MT to be turned on regardless of the threshold voltage, i.e. it is larger than the threshold voltage of any cell transistors MTs holding "0"

data. The potential Vvf is higher than a reading potential VR as shown in FIG. 5. The sequencer 12 applies the potential VBL to the bit line BL from the time t27. The potential VBL is higher than the potential VSS. Note that, during verification, the potential VSS is applied to the source line SL.

A result of such the application of a potential, in the sense amplifier and data latch 15, data held in the selected cell unit CU in the string unit SU0 is read from the sense amplifier. In addition, according to the instruction of the sequencer 12, the sense amplifier and data latch 15 compares the read data and the corresponding write data, and holds the result of the comparison in the unoccupied one among the data latches DL1, DL2 and DL3.

Similarly, from the time t28, the sequencer 12 compares the data written into the selected cell unit CU in the string unit SU1 and the corresponding write data. At this time, for example, the result of the comparison of data read from the selected cell unit CU in the string unit SU1 and the corresponding write data is held in the data latches DL1, DL2 or DL3 holding the write data into the verified string unit SU0, for example.

Figure 16:
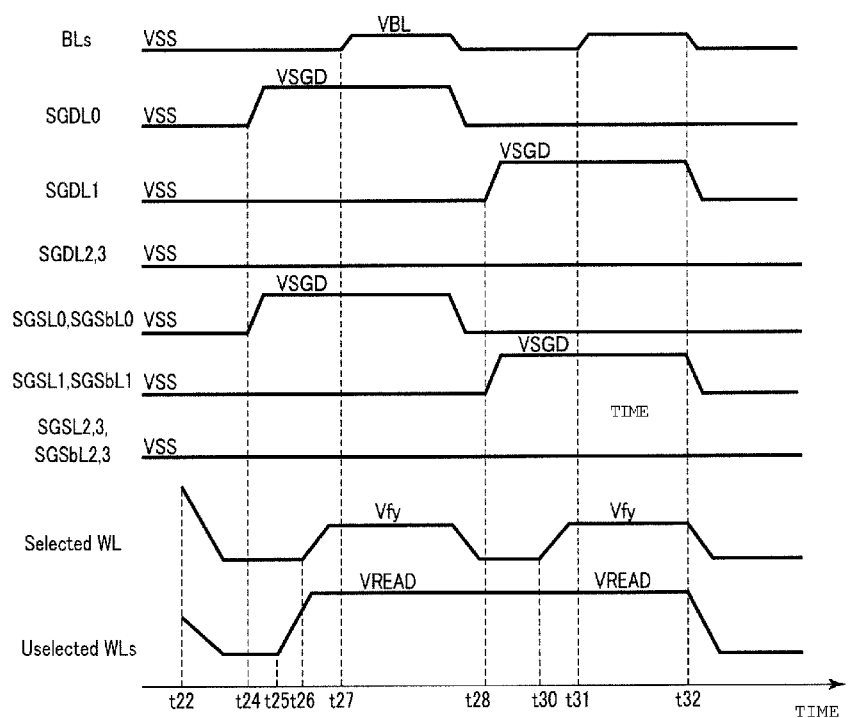
FIG. 16 shows, along the time axis, another example of potentials of several nodes at the time subsequent to FIG. 14.

As shown in FIG. 16, the potential applied to the unselected word line WL may be held to the potential VREAD without being returned to the potential VSS from the time t27 to the time t32. Thus, the selected word line WL is not charged/discharged, and the current consumption of the memory device 1 is less than that of the example of FIG. 15.

Figure 17:
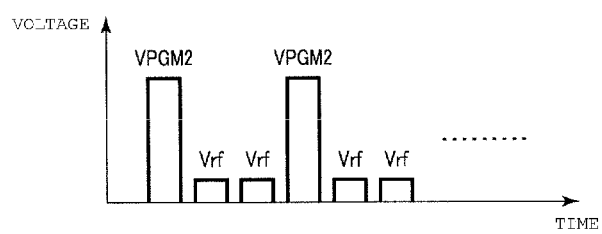
FIG. 17 shows a potential applied to a selected word line during writing in the memory device according to the second embodiment.

If the verification is not passed, a set (loop) of collective writing and the subsequent verification may be repeated on each string unit SU. FIG. 17 shows an example of a potential applied to a selected word line WL during collective writing with verification according to the second embodiment. As shown in FIG. 17, after the application of the potential VPGM2, the application of the verify potential Vrf for each string unit SU is performed. When the application of the verify potential Vrf for all of the string units SUs is completed, and the verification of all the string units SUs is not passed, the loop is repeated. That is, the application of the potential VPGM2, and multiple applications of the verify potential Vrf are performed. In the second or subsequent loop, the potential VPGM2 may be the same as or higher than that in the previous loop. For example, when the potential VPGM2 is lower than the potential VPGM, every time when the number of loops is increased, the program potential VPGM2 is increased.

Figure 18:
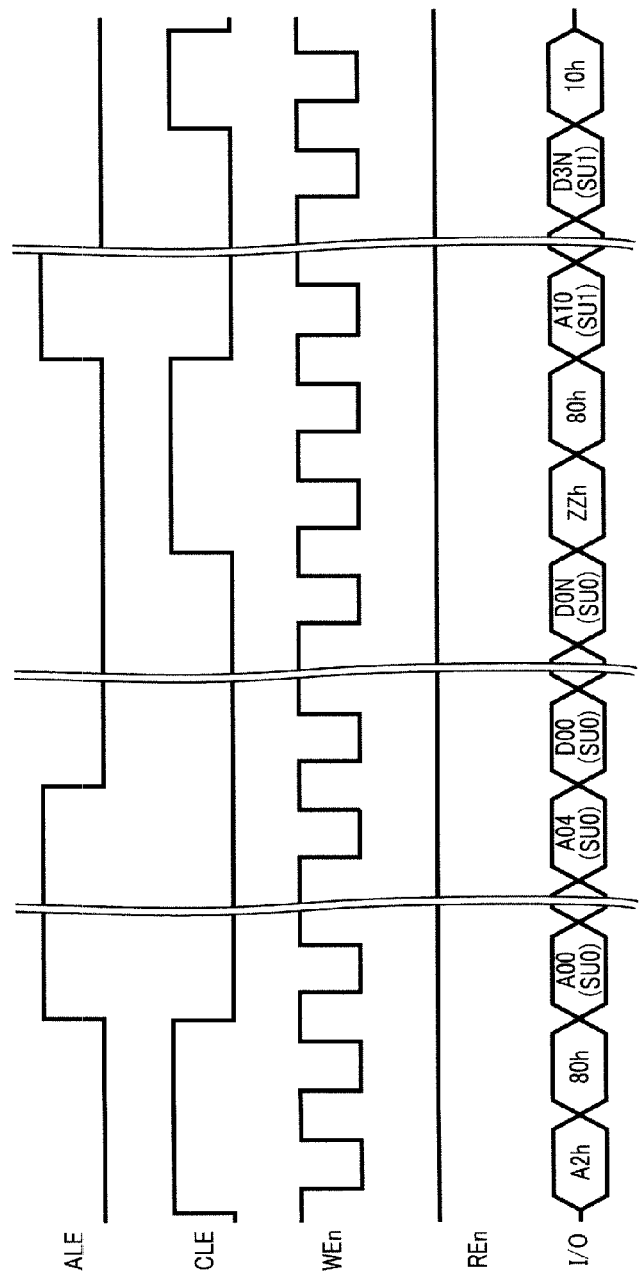
FIG. 18 shows, along the time axis, signals transmitted from the controller to the memory device during writing in the memory device according to the second embodiment.

For the writing in FIG. 14, the memory controller 2 transmits a command, an address signal and data to the memory device 1 as shown in FIG. 18. Until the transmission of data D1N, the process is the same as that in the first embodiment (FIG. 9). The sequencer 12 transmits a command 10h after the transmission of the data D1N.

Figure 19:
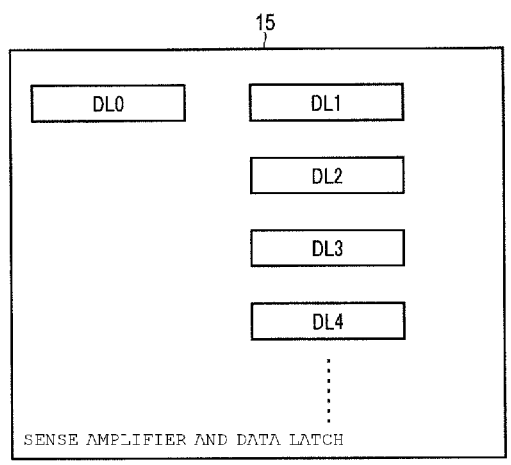
FIG. 19 shows a sense amplifier and data latch in the memory device according to the second embodiment.

In an alternative embodiment, the memory device 1 includes more data latches as shown in FIG. 19. By providing 5 or more data latches, the memory device 1 can collectively write data into three or more string units SUs. For example, as in the first embodiment, the memory device 1 has as many data latches as allowing collectively writing into four string units SUs. Also in the case of collective writing into four string units SUs with verification, verification for each string unit SU is sequentially performed. In other words, from the time t32 in FIG. 14, the verification is performed on the string unit SU2 and subsequent string units.

Figure 20A:
FIGS. 20A and 20B show, along the time axis, writing in the memory device according to the second embodiment and normal wiring.
Figure 20B:

According to the second embodiment, as in the first embodiment, in each of a plurality of string units, each of strings STRs in each of the string units SUs is sequentially set to a writable state or a write protected state, and, by the application of the program potential VPGM, data is collectively written into the string units SUs containing the strings STRs in which the state has been already set. Therefore, the same advantages as the first embodiment can be obtained. Assuming that it takes 50 µs to perform verification, for example, it takes 40 µs+10 µs×3+50 µs×4=270 µs to perform the collective writing of 4 pages with verification according to the second embodiment, as shown in FIG. 20A. It is 270 µs/360 µs=25% shorter than the traditional way, as shown in FIG. 20B (the same as in that in FIG. 11A).

Third Embodiment

A third embodiment is based on the first embodiment, and is different from the first embodiment in terms of the structure of the cell array.

Figure 21:
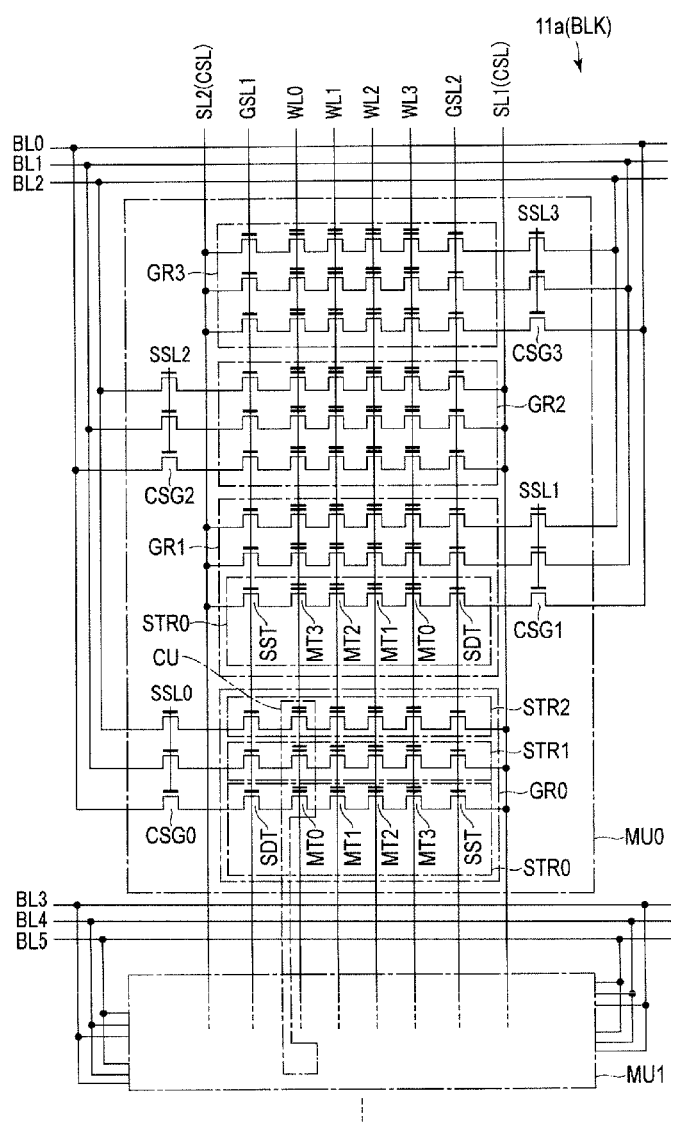
FIG. 21 shows elements and connections in a cell array of a memory device according to a third embodiment, and associated elements.

A cell array 11a of the third embodiment has the elements and connections shown in FIG. 21 instead of the structure shown in FIGS. 1 and 2 in the first embodiment. FIG. 21 shows elements and connections in the cell array of a memory device according to the third embodiment, and associated elements. The cell array 11a includes a plurality of blocks BLKs, each block BLK including a plurality of memory units MUs (MU0, MU1, . . . ). FIG. 21 shows two memory units MUs. Each memory unit MU includes a plurality of string units GRs (GR0 to GRk (GR3)).

Each string unit GR includes a plurality of strings STRs (STR0 to STRj). The number j is a natural number, and is 2 in the following description. Each string STR includes the selection gate transistor SDT, a plurality of cell transistors MTs (MT0 to MT3) and the selection gate transistor SST. The transistors SDT, MT0 to MT3 and SST are connected in series in this order.

Three strings STRs in each string unit GR have one end connected to three bit lines BLs (BL0, BL1 and BL2) through the selection gate transistors CSGs (CSG0 to CSG2), respectively, and have another end connected to one source line SL (SL1 or SL2).

The string STR0 in the string unit GR0 in the memory unit MU0 is connected to the bit line BL0 through a column selection transistor CSG0 on the side of the selection gate transistor SDT. Similarly, for each z (z is a natural number equal to or less than k (=3)), and each v (v is a natural number equal to or less than j (=2)), the string STRv in the string unit GRz in the memory unit MU0 is connected to the bit line BLv through a column selection transistor CSGv on the side of the selection gate transistor SDT. Thus, as many bit lines BLs as the strings STRs included in the memory unit MU0 are associated with the memory unit MU0. Similarly, for each w (w is a natural number), each z and each v, the string STRv in the string unit GRz in the memory unit MUw is connected to the bit line BL (v+3w) through a column selection transistor CSGv on the side of the transistor SDT.

For each z, each of three transistors CSGz in total is connected to the gate of the control signal line SSLz. In addition, each column selection transistor CSGz in a plurality of different memory units MUs is also connected to the gate of the control signal line SSLz. The control signal lines SSLs (SSL0 to SSL3) are controlled by the column decoder 16, for example.

Each of the string units GR0 and GR2 having even addresses is connected to the source line SL1 on the side of the selection gate transistors SST. Each of the string units GR1 and GR3 having odd addresses is connected to the source line SL2 on the side of the selection gate transistors SST. The source lines SL1 and SL2 are connected to each other (not shown), and controlled by the driver 13.

The selection gate transistor SDT in the string units GR0 and GR2 having even addresses and the selection gate transistor SST in the string units GR1 and GR3 having odd addresses are connected to each gate of the selection gate line GSL1. The selection gate transistor SDT in the string units GR1 and GR3 having odd addresses and the selection gate transistor SST in the string units GR0 and GR2 having even addresses are each connected to each gate of the selection gate line GSL2.

Each of the gates of the cell transistors MT0 in the string units GR0 and GR2 having even addresses, and each of the gates of the cell transistors MT3 in the string units GR1 and GR3 having odd addresses are connected to the word line WL0. Similarly, for each u (u is a natural number equal to or less than n+1), each of the gates of the cell transistors MTu in the string units GR0 and GR2 having even addresses, and each of the gates of the cell transistors MT (n−u) in the string units GR1 and GR3 having odd addresses are connected to the word line WLu.

A plurality of cell transistors MTs connected to the same word line WL of the string units GRs having the same address in a plurality of the memory units MU form a cell unit CU.

Figure 22:
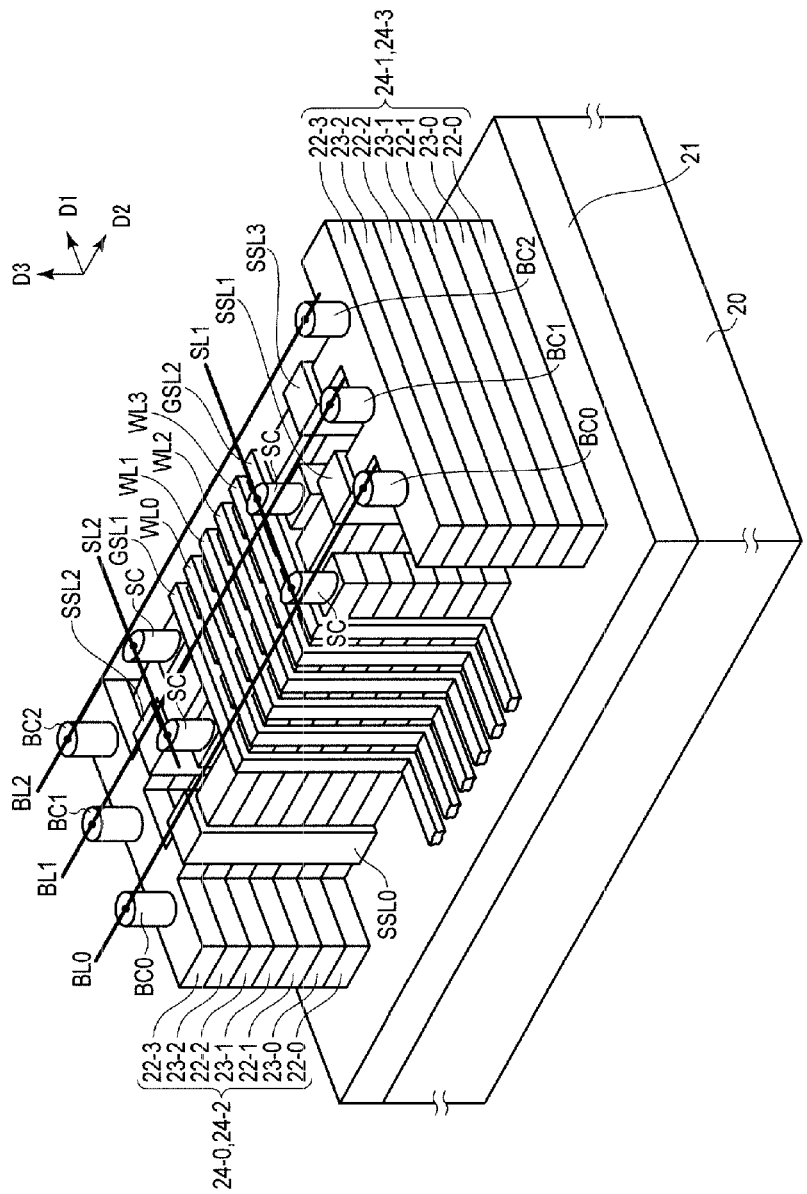
FIG. 22 shows a perspective view of a portion of the memory cell array of the memory device according to the third embodiment.

FIG. 22 is a perspective view of a portion of the memory cell array 11a, and shows the structure of the memory unit MU0. The memory cell array 11a is provided on an insulator 21 on a semiconductor substrate 20 shown in FIG. 22.

A plurality of fin type structures 24 (24-0 to 24-3) are provided on the insulator 21. Corresponding to FIG. 21 in which one memory unit MU includes four string units GRs, FIG. 22 shows four fin type structures 24 as an example. The fin type structures 24 extend along the D2 axis, and are arranged to be spaced apart from each other along the D1 axis. The D1 axis and the D2 axis are, for example, parallel to the substrate 20, and orthogonal to the vertical D3 axis perpendicular to the substrate 20. The D1 axis and the D2 axis are orthogonal to each other.

Each fin type structure 24 includes insulators 22 (22-0, 22-1, 22-2 and 22-3) and semiconductors 23 (23-0, 23-1 and 23-2) which are alternately stacked. Corresponding to FIG. 21 in which each string unit GR includes three strings STRs, FIG. 22 shows three semiconductors 23 as an example. The fin type structures 24-0 to 24-3 provide current paths for the string units GR0 to GR3 (channel regions), respectively. The bottom semiconductor 23-0, the semiconductor 23-1 and the top semiconductor 23-2 provide channel regions for the strings STR0 to SR2, respectively.

On the upper surface and on the side surface of each fin type structure 24, the conductive selection gate line GSL1, the conductive word lines WL0 to WL3 and the conductive selection gate line GSL2 are provided. The selection gate line GSL1, the word lines WL0 to WL3 and the selection gate line GSL2 have a band shape spread along the D1 axis over the fin type structures 24-0 to 24-3. The selection gate line GSL1, the word lines WL0 to WL3 and the selection gate line GSL2 are arranged to be spaced from each other in this order from the back along the D2 axis. The selection gate lines GSL1 and GSL2 cover the fin type structure 24 through an insulator. Each word line WL covers the fin type structure 24 through a tunnel insulator, the insulating or conductive charge storage film and the block insulator which are stacked in this order from the surface of the fin type structure 24.

The region surrounded by the selection gate line GSL1 and each semiconductor 23 functions as a selection gate transistor SDT or SST. The region surrounded by the selection gate line GSL2 and one semiconductor 23 functions as a selection gate transistor SDT or SST. The region surrounded by the word line WL and a semiconductor 23 functions as a transistor MT.

In the fin type structure 24-0, the upper surface and the side surface in the back of the selection gate line GSL1 along the D2 axis is covered with the conductive control signal line SSL0 through an insulator. In the fin type structure 24-1, the upper surface and the side surface in the front of the selection gate line GSL2 along the D2 axis is covered with the conductive control signal line SSL1 through an insulator. In the fin type structure 24-2, the upper surface and the side surface in the back of the selection gate line GSL1 along the D2 axis is covered with the conductive control signal line SSL2 through an insulator. In the fin type structure 24-3, the upper surface and the side surface in the front of the selection gate line GSL2 along the D2 axis is covered with the conductive control signal line SSL3 through an insulator.

The region surrounded by the control signal line SSL0 and each semiconductor 23 functions as a selection gate transistor CSG0. The region surrounded by the control signal line SSL1 and each semiconductor 23 functions as a selection gate transistor CSG1. The region surrounded by the control signal line SSL2 and each semiconductor 23 functions as a selection gate transistor CSG2. The region surrounded by the control signal line SSL3 and each semiconductor 23 functions as a selection gate transistor CSG3.

The fin type structures 24-0 and 24-2 for the string unit GR having even addresses are connected to each other by a structure extending along the D3 axis in the back of the control signal lines SSL0 and SSL2 along the D2 axis. This interconnect portion has the same stacked structure as that of the fin type structure 24. Similarly, the fin type structures 24-1 and 24-3 for the string unit GR having odd addresses are connected to each other by a structure extending along the D3 axis in the front of the control signal lines SSL1 and SSL3 along the D2 axis. This interconnect portion has the same stacked structure as that of the fin type structure 24. Contact plugs BC0, BC1 and BC2 are provided on each of the two connect portions.

The contact plug BC0 is connected to the semiconductor 23-0 and the bit line BL0, and insulated from the semiconductors 23-1 and 23-2. The contact plug BC1 is connected to the semiconductor 23-1 and the bit line BL1, and insulated from the semiconductor layers 23-0 and 23-2. The contact plug BC2 is connected to the semiconductor layer 23-2 and the bit line BL2, and insulated from the semiconductors 23-0 and 23-1. The bit lines BL0, BL1 and BL2 are located on the upper side of the fin type structure 24. In other memory unit MU, the bit lines BL0 to BL2 are replaced with three corresponding bit lines BLs.

The upper surfaces of the fin type structures 24-0 and 24-2 are connected to the source line SL1 through the contact plug SC in the front of the selection gate line GSL2 along the D2 axis. The upper surfaces of the fin type structures 24-1 and 24-3 are connected to the source line SL2 through the contact plug SC in the back of the selection gate line GSL1 along the D2 axis.

FIG. 23 shows, along the time axis, potentials of several nodes in one selected block BLK during writing in the memory device 1 according to the third embodiment. FIG. 23 is similar to FIG. 6 (first embodiment), and different from FIG. 6 in terms of the control signal line SSL, the source line CSL, and the selection gate lines GSL1 and GSL2. FIG. 23 shows an example of collective writing into the string units GRs (GR0, GR2, . . . , GR2*j*) having even addresses. At the start of writing, the potential VSS is applied to every control signal line SSL.

During writing, the sequencer 12 maintains the potential of the selection gate line GSL1 to a high potential (for example, the power supply potential VCC). The potential VCC is higher than the potential VSS. By the selection gate line GSL1 having the potential VCC, a transistor SDT in a string unit GR having an even address is on. Therefore, under the control of the corresponding control signal line SSL, the string unit GR having an even address maintains a state in which the connection to the bit line BL may be controlled.

During writing, the sequencer 12 also maintains the potential of the source line CSL to the potential VCC. The potential VCC has such a magnitude that can prevent writing by the application of the potential VPGM in the string STR connected to the line having the potential VCC as in the potential VINH. The selection gate line GSL1 has the potential VCC in order to remain in the state in which the string unit GR to be written may be connected to the bit line BL, thus, the transistors SSTs in the string units GRs (GR1, GR3, . . . , GR2*j*+1) having odd addresses targeted for non-writing are also turned on. However, in the source line CSL having the potential VCC, the erroneous writing into the cell transistor MT connected to the selected word line WL is suppressed by the electrons flowing into the string unit GR having odd addresses from the source line CSL.

In addition, during writing, the sequencer 12 maintains the selection gate line GSL2 to the potential VSS. By the selection gate line GSL2 having the potential VSS, a transistor SST in a string unit GR having an even address is off, and the string unit GR having an even address is disconnected from the source line SL1 (CSL).

In addition, during writing, the sequencer 12 maintains the control signal lines SSL1, SSL3, . . . , SSL2*j*+1 in the string units GRs having odd addresses to the potential VSS.

In such a state, as in the first embodiment, based on the write data, the sequencer 12 sets the strings STRs in a plurality of string units GRs having even addresses to a writable state or a write-protected state. That is, after the time t1, from the time t31 to the time t34, the sequencer 12 applies a potential corresponding to data GR0_Data to be written into a selected cell unit CU in the string unit GR0 to a bit line BL, and, from the time t32 to the time t33, applies the potential VSGD to the control signal line SSL0. Similarly, the sequencer 12 sequentially sets each string STR in each of the remaining string units GRs having even addresses to a writable state or a write-protected state.

When the state of each string STR in all the string units GRs subject to collective writing is set, at the time T41, the sequencer 12 applies the potential VPGM to the selected word line WL. By this application, data is collectively written into all the cell units CUs in all the string units GRs having even addresses subject to collective writing.

According to the third embodiment, even in the cell array having the structure of FIG. 21 and FIG. 22, the same advantages as the first embodiment can be obtained.

Further, in each embodiment, the following points may be applied.

In a multi-level read operation (read), voltage applied to a word line that is selected for an A level read operation is, for example, between 0 V and 0.55 V. Without being limited to this, it may be any of from 0.1 V to 0.24 V, from 0.21 V to 0.31 V, from 0.31 V to 0.4 V, from 0.4 V to 0.5 V or from 0.5 V to 0.55 V.

Voltage applied to a word line that is selected for a B level read operation is, for example, between 1.5 V and 2.3 V. Without being limited to this, it may be any of from 1.75 V to 1.8V, from 1.8 V to 1.95 V, from 1.95 V to 2.1 V and from 2.1 V to 2.3 V.

Voltage applied to a word line that is selected for a C level read operation is, for example, between 3.0 V and 4.0 V. Without being limited to this, it may be any of from 3.0 V to 3.2 V, from 3.2 V to 3.4 V, from 3.4 V to 3.5 V, from 3.5 V to 3.7 V and from 3.7 V to 4.0 V.

The time (tR) of the read operation may be, for example, any of 25 μs to 38 μs, 38 μs to 70 μs or 70 μs to 80 μs.

The write operation includes a program operation and a verification operation. In the write operation, voltage first applied to a word line that is selected at the time of a program operation is, for example, between 13.7 V and 14.3 V. Without being limited to this, it may be any of from 13.7 V to 14.0 V and from 14.0 V to 14.7 V.

Voltage first applied to the selected word line in performing writing on an odd-numbered word line, and voltage last applied to the selected word line in performing writing on an even-numbered word line may be changed.

When an ISPP (Incremental Step Pulse Program) method is used for a program operation, for example, about 0.5 V of step-up voltage may be considered.

Voltage applied to an unselected word line may be, for example, between 7.0 V and 7.3 V. Without being limited to this, for example, it may be from 7.3 V to 8.4 V, or may be equal to or less than 7.0 V.

Pass voltage to be applied may be changed depending on whether an unselected word line is an odd-numbered word line or an even-numbered word line.

The time (tProg) of the write operation may be, for example, any of from 1,700 μs to 1,800 μs, from 1,800 μs to 1,900 μs and from 1,900 μs to 2,000 μs.

In an erase operation, voltage first applied to a well which is formed on the upper portion of a semiconductor substrate and where the memory cell is located in the upper portion thereof is, for example, between 12 V and 13.7 V. Without being limited to this, for example, it may be any of from 13.7 V to 14.8 V, from 14.8 V to 19.0 V, from 19.0 V to 19.8 V and from 19.8 V to 21 V.

The time (tErase) of the erase operation may be, for example, any of from 3,000 μs to 4,000 μs, from 4,000 μs to 5,000 μs and from 4,000 μs to 9,000 μs.

The memory cell has a charge storage layer arranged on the semiconductor substrate (silicon substrate) through a tunnel insulating film having a thickness of from 4 to 10 nm. The charge storage layer has a stacked structure where an insulating film such as SiN or SiON having a thickness of from 2 to 3 nm and polysilicon having a thickness of from 3 to 8 nm are stacked. Furthermore, metal such as Ru may be added to the polysilicon. An insulating film is formed on the charge storage layer. The insulating film has, for example, silicon oxide film having a thickness of from 4 to 10 nm sandwiched between a lower layer High-k film having a thickness of from 3 to 10 nm and an upper layer High-k film having a thickness of from 3 to 10 nm. HfO and the like is used as the High-k film. Further, the thickness of the silicon oxide film may be thicker than the thickness of the High-k film. A control electrode having a thickness of from 30 nm to 70 nm is formed on the insulating film through a material having a thickness of from 3 to 10 nm. Here, such a material is a metal oxide film such as TaO or a metal nitride film such as TaN. W or the like may be used as the control electrode.

Further, an air gap may be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
   a first memory string including a first selection transistor and a first memory cell;
   a second memory string including a second selection transistor and a second memory cell;
   a bit line electrically connected to the first memory string and the second memory string; and
   a control circuit configured to perform a collective write operation on the first memory cell and the second memory cell by applying a voltage to turn on the first transistor, a voltage to turn on the second transistor, and then a program voltage at the same time to gates of the first and second memory cells.

2. The memory device according to claim 1, wherein the control circuit is configured to apply a first voltage to the gates of the first and second memory cells at a start of the collective write operation and then to increase the voltage applied to the gates of the first and second memory cells to a second voltage that is higher than the first voltage and less than the program voltage while the voltages to turn on the first and second transistors are applied.

3. The memory device according to claim 2, wherein the bit line is at the first voltage when the voltages to turn on the first and second transistors are applied.

4. The memory device according to claim 1, wherein
   the first memory string includes a third memory cell and the second memory string includes a fourth memory cell, and
   the control circuit is configured to apply the second voltage to the gates of the third and fourth memory cells while the voltages to turn on the first and second transistors are applied and while the program voltage is applied to the gates of the first and second memory cells.

5. The memory device according to claim 1, wherein the control circuit is configured to perform the collective write operation upon receiving a first write command from an external source, and to perform a normal write operation in which the program voltage is applied to the gates of the first and second memory at different times upon receiving a second write command from the external source.

6. The memory device according to claim 5, wherein the control circuit is configured to perform a write verify operation as part of the normal write operation, and is configured to not perform the write verify operation as part of the collective write operation.

7. The memory device according to claim 5, wherein the control circuit is configured to perform the normal write operation with a lower initial program voltage than when performing the collective write operation.

8. The memory device according to claim 1, further comprising:
   a first word line electrically connected to the gate of the first memory cell;
   a second word line electrically connected to the gate of the second memory cell; and
   a control gate line electrically connected in common to the first and second word lines.

9. The memory device according to claim 1, wherein the first memory string includes a plurality of memory cells that are formed along a semiconductor pillar that extends substantially perpendicular with respect to a planar surface of a semiconductor substrate.

10. The memory device according to claim 1, wherein the first memory string includes a plurality of memory cells that are formed along a semiconductor fin that extends substantially parallel with respect to a planar surface of a semiconductor substrate.

11. A memory system comprising:
    a memory controller; and
    a memory device including a bit line, first and second memory strings electrically connected to the bit line, and a control circuit configured to perform a collective write operation on a first memory cell, which is a part of the first memory string, and a second memory cell, which is a part of the second memory string, in response to a collective write command from the memory controller, and a normal write operation on the first memory cell and the second memory cell in response to a normal write command from the memory controller, wherein
    during the collective write operation, a program voltage is applied at the same time to gates of the first and second memory cells.

12. The memory system according to claim 11, wherein the memory controller is configured to issue first address data and first write data in this order and then second address data and second write data in this order, after issuing the collective write command to the memory device.

13. The memory system according to claim 11, wherein the memory controller is configured to issue first address data and first write data in this order, and then second write data without sending any address data between the first write data and the second write data.

14. The memory system according to claim 11, wherein the control circuit is configured to perform the normal write operation by applying the program voltage to the gates of the first and second memory at different times.

15. The memory system according to claim 11, wherein the control circuit is configured to perform a write verify operation as part of the normal write operation, and is configured to not perform the write verify operation as part of the collective write operation.

16. The memory system according to claim 15, wherein the control circuit is configured to perform the normal write operation with a lower initial program voltage than when performing the collective write operation.

17. A method of performing a first write operation on a memory device in response to a first write command and a second write operation on the memory device in response to a second write command, wherein the memory device includes a bit line, and first and second memory strings electrically connected to the bit line, the first memory string including a first memory cell and the second memory string including a second memory cell, said method comprising:
    in response to the first write command, performing the first write operation on the first and second memory cells by applying a program voltage at the same time to gates of the first and second memory cells; and in response to the second write command, performing the second write operation on the first and second memory cells by applying the program voltage to the gates of the first and second memory cells at different times.

18. The method according to claim 17, wherein the first write operation does not include a write verify operation and the second write operation includes a write verify operation.

19. The method according to claim 17, wherein the first write operation employs a higher initial program voltage than the second write operation.

20. The method according to claim 17, wherein
the memory device includes a first word line electrically connected to the gate of the first memory cell and a second word line electrically connected to the gate of the second memory cell, and
a same voltage is applied to the first and second word lines during the first and second write operations.

* * * * *